United States Patent
Yasukawa et al.

(10) Patent No.: US 6,768,522 B2
(45) Date of Patent: Jul. 27, 2004

(54) ELECTROOPTICAL DEVICE, PREJECTION-TYPE DISPLAY APPARATUS, AND METHOD FOR MANUFACTURING THE ELECTROOPTICAL DEVICE

(75) Inventors: Masahiro Yasukawa, Chino (JP); Yasushi Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/428,988

(22) Filed: May 5, 2003

(65) Prior Publication Data

US 2003/0210363 A1 Nov. 13, 2003

Related U.S. Application Data

(62) Division of application No. 09/985,907, filed on Nov. 6, 2001, now Pat. No. 6,583,830, which is a continuation of application No. PCT/JP01/03359, filed on Apr. 19, 2001.

(30) Foreign Application Priority Data

Apr. 21, 2000 (JP) ........................................ 2000-121454
Jan. 10, 2001 (JP) ........................................ 2001-003029

(51) Int. Cl.[7] .......................................... G02F 1/1368
(52) U.S. Cl. ........................... 349/43; 349/39; 349/110; 349/111
(58) Field of Search ........................... 349/38, 39, 42, 349/43, 44, 110, 111, 5; 257/59, 72

(56) References Cited

U.S. PATENT DOCUMENTS

| 5,233,211 A | 8/1993 | Hayashi et al. |
| 5,446,562 A | 8/1995 | Sato |
| 6,449,022 B1 * | 9/2002 | Fukata et al. ............... 349/44 |

FOREIGN PATENT DOCUMENTS

| JP | 7-72473 A | 3/1995 |
| JP | 9-90339 A | 4/1997 |
| JP | P2000-91581 | * 3/2000 |

* cited by examiner

Primary Examiner—Toan Ton
Assistant Examiner—Tai Duong
(74) Attorney, Agent, or Firm—Oliff & Berridge, PLC

(57) ABSTRACT

In a TFT array substrate 10 of an electrooptical device, a scanning line 3a, a drain electrode 11, a first light shield layer 13, and a data line 3a are laminated over a channel region 1a' of a TFT 30 and a second light shield layer 14 is laminated beneath the channel region 1a'. A side wall formation trench 16 is formed beside the channel region 1a' of the TFT 30, and in the side wall formation trench a conductive layer having a light shield property is concurrently formed with the first light shield layer 13 thereby a light shield side wall 131 is formed. By three-dimensionally blocking light's entry towards the channel region 1a', obliquely or laterally incident light is prevented from entering the channel region of a pixel switching TFT, and the TFT 30 is free from erratic operations and reliability degradation.

17 Claims, 25 Drawing Sheets

Fig. 23
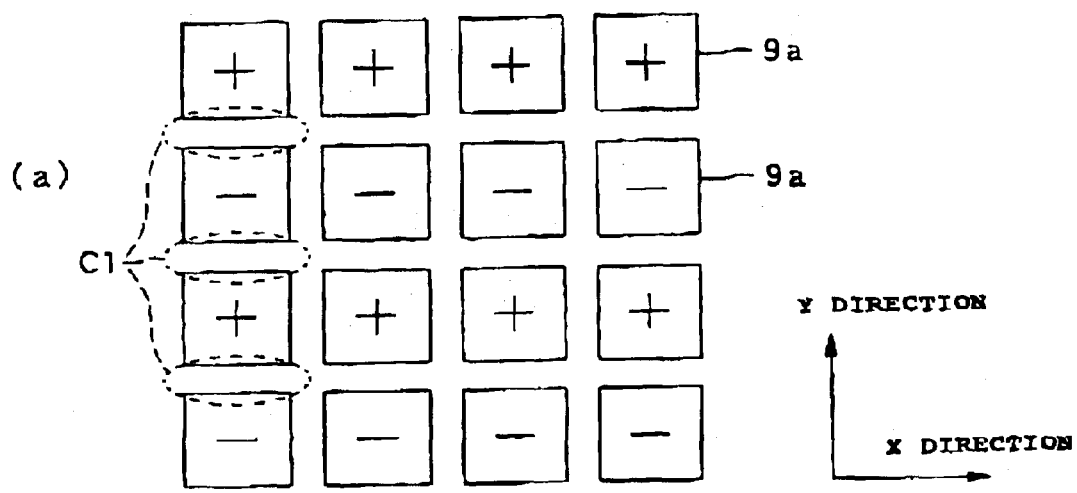
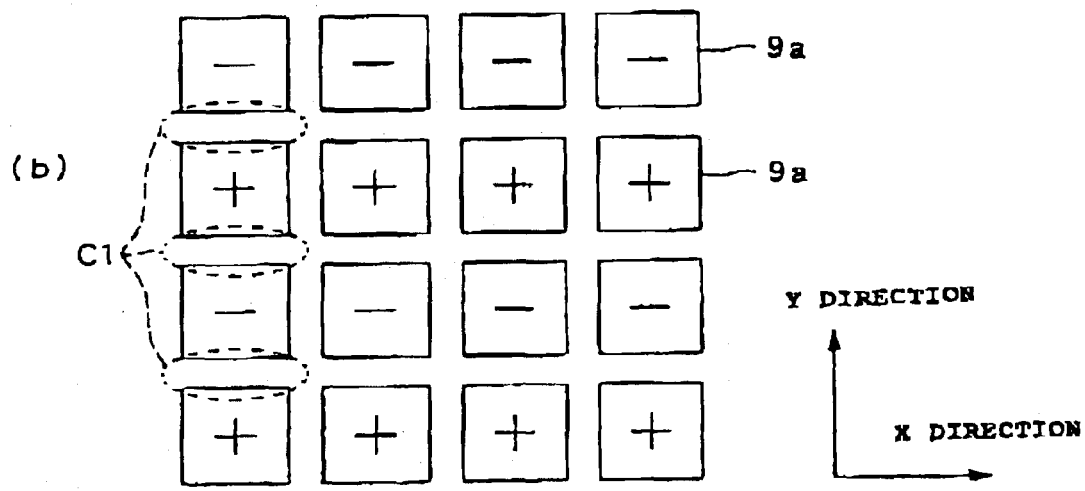

ELECTROOPTICAL DEVICE, PREJECTION-TYPE DISPLAY APPARATUS, AND METHOD FOR MANUFACTURING THE ELECTROOPTICAL DEVICE

This is a Division of application Ser. No. 09/985,907 filed Nov. 6, 2001 now U.S. Pat. No. 6,583,830, which in turn is a Continuation of PCT/JP01/03359 filed Apr. 19, 2001. The entire disclosure of the prior applications is hereby incorporated by reference herein in its entirety.

BACKGROUND OF THE INVENTION

1. Field of Invention

The present invention relates to an active-matrix type electrooptical device, a projection-type display apparatus incorporating the electrooptical device, and a method for manufacturing the electrooptical device. Particularly, the present invention relates to an electrooptical device having a pixel switching thin-film transistor (TFT) in a laminate structure formed on a substrate thereof, a projection-type display apparatus incorporating the electrooptical device as a light valve, and a manufacturing method for manufacturing the electrooptical device.

2. Description of Related Art

Active-matrix type electrooptical devices suffer from a change in TFT characteristics as a result of photocurrent leakage that occurs when incident light enters a channel region of a pixel switching TFT in each pixel. Since an electrooptical device for use as a light valve in a projector uses a high-intensity light ray, blocking the admittance of light into the channel region of the TFT and the peripheral area of the channel region is important. A light shield layer, arranged on a counter substrate, that defines an aperture area of each pixel, or a data line, fabricated of a metal layer such as Al (aluminum) running over the TFT on a TFT array substrate blocks the admittance of light into the channel region or its peripheral area, A light shield layer, fabricated of a refractory metal, for example, is arranged on the TFT array substrate in a position facing the TFT from below. Such a light shield layer arranged beneath the TFT prevents light back-reflected from the TFT array substrate from entering the TFT in the electrooptical device. For example, in an optical system that is composed of a plurality of electrooptical devices combined with a prism, such a light shield layer prevents returning light such as a light ray passing through the prism from another electrooptical device from entering the TFT in one electrooptical device of interest.

For example, such an electrooptical device, having high light-shield performance, can be used as a light valve in a projection-type display apparatus which is subject to high-intensity light.

SUMMARY OF THE INVENTION

The above light shield techniques have the following disadvantages. For example, in the technique of using a light shield layer formed on a counter substrate or a TFT array substrate, the light shield layer and the channel region are substantially spaced apart from each other with a liquid-crystal layer, an electrode, and an interlayer insulator that are interposed therebetween. However, the light shield performance for blocking light that is obliquely incident on the area between the light shield layer and the channel region is not sufficient enough. In a compact electrooptical device to use as a light valve in a projector, the incident light is a light beam into which a lens converges light from a light source, and contains a significant component of obliquely incident light (for example, 10% of the incident light is oblique by 10 degrees to 15 degrees with respect to a direction normal to the substrate). Such insufficient light shield performance to the obliquely incident light creates a problem in operation.

Light entering the electrooptical device through an area having no light shield layer may be reflected off the top surface of the substrate, the top surface of the light shield layer formed on the substrate, or the underside of the data line, i.e., the inner surface of the data line facing the channel region. The light reflected in this way may be reflected again off the top surface of the substrate, or the inner surfaces of the light shield layer and the data line, thereby causing multiple reflections. The multiple reflections may reach the channel region of the TFT.

As a demand for display image with higher quality in the electrooptical device increases, the electrooptical device has a higher definition and a finer pixel pitch. Furthermore, as incident light rays intensifies in level to present a brighter image, a variety of conventional light shield techniques become unable to sufficiently block the admittance of light. Stray light causes a change in transistor characteristics of the TFT, resulting in flickering and leading to degradation of the display image quality.

Expanding the formation area of the light shield layer has been contemplated to increase light tightness. Expanding the formation area of the light shield layer makes it difficult to increase the aperture ratio of each pixel. It is noted that the aperture ratio needs to be increased for a brighter display image. The light shield layer beneath the TFT and the light shield layer (ex. a data line) over the TFT result in internal reflections and multiple reflections of obliquely incident light rays. The expanding of the formation area of the light shield layer increases internal reflections and multiple reflections of light and thus causes problems.

In view of at least the above problems, the present invention has been developed. It is an object of the present invention to provide an electrooptical device which features high light tightness, and presents a bright and high-quality image, a projection-type display apparatus incorporating the electrooptical device, and a method for manufacturing the electrooptical device.

To resolve the above problems, a first electrooptical device of the present invention includes a first substrate, a pixel electrode arranged above the first substrate, a thin-film transistor arranged above the first substrate and connected to the pixel electrode, and a first light shield layer arranged over the gate electrode of the thin-film transistor formed over and facing the channel region of the thin-film transistor with a gate insulator interposed therebetween, wherein the first light shield layer is formed, laterally surrounding the channel region as a light shield side wall.

In accordance with the first electrooptical device of the present invention, the first light shield layer deposited above the channel region of the TFT prevents light coming in from the top side of the first substrate from entering the channel region. The first light shield layer, laterally surrounding the channel region as the light shield side wall, prevents light from entering obliquely or laterally into the channel region. Since the present invention prevents light coming in from the top side of the first substrate from entering the channel region of the TFT, the electrooptical device is free from erratic operations of the TFT and a drop in reliability of the TFT.

In one embodiment, the first electrooptical device of the present invention can include a second substrate opposed to the first substrate, and an electrooptical material interposed between the first substrate and the second substrate. This embodiment presents a light-tight electrooptical device, such as a liquid crystal device, having the electrooptical material interposed between a pair of the substrates.

In another embodiment of the first electrooptical device of the present invention, a matrix of the pixel electrodes and the thin-film transistors can be arranged on the first substrate. In accordance with this embodiment, an active-matrix type electrooptical device such as a liquid crystal device having high light tightness can be achieved.

In another embodiment of the first electrooptical device of the present invention, the light shield side wall can be formed of the first light shield layer formed in a light shield side wall formation trench formed in an insulator below the first light shield layer.

The first electrooptical device having the above construction can be manufactured using the following method. Specifically, a method for manufacturing an electrooptical device including a first substrate, a pixel electrode arranged above the first substrate, and a TFT arranged above the first substrate and connected to the pixel electrode, includes forming, above the first substrate, the TFT including a channel region, a gate insulator formed on the channel region, and a gate electrode on the gate insulator, with the gate electrode facing the channel region with the gate insulator interposed therebetween. The method can further include depositing at least one interlayer insulator covering the TFT subsequent to the formation of the TFT, forming, in the interlayer insulator, a side wall formation trench that runs by the side of the channel region of the TFT, and depositing a first light shield layer covering at least the channel region of the TFT, wherein the first light shield layer is also deposited in the side wall formation trench as a light shield side wall when the first light shield layer is formed.

In another embodiment of the first electrooptical device of the present invention, a drain electrode, formed over a drain region of the TFT, is electrically connected to the drain region of the TFT, the pixel electrode, formed over a drain electrode, is electrically connected to the drain electrode, and the drain electrode is fabricated of a conductive layer having a light shield property formed over and covering the channel region. In this embodiment, besides the first light shield layer, the drain electrode having a light shield property blocks light, thereby reliably preventing light from entering the channel region.

In this embodiment, it is preferable that the drain electrode and the first light shield layer form a storage capacitor with an insulator, as a dielectric layer, interposed between the drain electrode and the first light shield layer preferably form a storage capacitor. In this arrangement, each of the drain electrode and the first light shield layer is wide enough to cover the channel region. By using the insulator interposed therebetween as a dielectric layer, a storage capacitor is formed. This arrangement eliminates the need for routing a capacitive line to each pixel, thereby increasing the aperture ratio of each pixel.

In another embodiment of the first electrooptical device of this invention, a data line formed over the source region of the TFT is electrically connected to a source region of the TFT. Also, the data line is fabricated of a conductive layer having a light shield property and covering the channel region from above. In this embodiment, beside the first light shield layer, the data line having a light shield property blocks light, thereby preventing light from entering the channel region. In this embodiment, an active layer of the TFT is preferably formed of a semiconductor layer that is arranged beneath the data line and within the formation area of the data line.

In this arrangement, the data line having a light shield property blocks light to the entire semiconductor layer forming the TFT, and the TFT is formed within the formation area of the data line. The pixel aperture ratio is thus increased. In this case, the data line extends in a line having an equal line width.

In another embodiment of the first electrooptical device of the present invention, a second light shield layer is laminated below the channel region. Light, which is reflected off the first substrate or is reflected outside the first substrate and enters again the first substrate from behind, is blocked by the second light shield layer in this arrangement. The electrooptical device is free from erratic operations of the TFT and a drop in reliability of the TFT, which can be caused when the reflected light enters the channel region of the TFT.

In this embodiment, preferably, the first light shield layer is routed through the side wall formation trench and is electrically connected to the second light shield layer.

Since the channel region of the TFT is entirely laterally surrounded by the first light shield layer, the light shield side wall, and the second light shield layer in this arrangement, light coming in from any direction is reliably blocked. Since the first light shield layer and the second light shield layer are electrically connected to each other, fixing the second light shield layer to a potential automatically fixes the first light shield layer to the same potential. The first light shield layer is easily used as a fixed-potential capacitive electrode of a storage capacitor.

In this case, the first light shield layer may be directly connected to the second light shield layer, or may be connected to the second light shield layer through another conductive layer having a light shield property. When the first light shield layer is connected to the second light shield layer through another conductive layer having a light shield property, a conductive layer, fabricated of the same material as the conductive layer forming the gate electrode, may be deposited on the bottom of the side wall formation trench, and the light shield side wall may be formed on the conductive layer.

In the manufacturing of the first electrooptical device, a second light shield layer, an underlayer insulator, a semiconductor layer forming the thin-film transistor, and a gate insulator of the thin-film transistor are deposited on the surface of the first substrate, prior to formation of the thin-film transistor on the top side of the first substrate. After forming a connection trench in the gate insulator and the underlayer insulator, running by the side of the channel region of the thin-film transistor and reaching the second light shield layer, a conductive layer, which forms the gate electrode, is also deposited in the connection trench when the gate electrode is produced. The interlayer insulator is deposited on the gate electrode, and then, the side wall formation trench is formed, communicating and being integral with the connection trench when the side wall formation trench is formed. Subsequently, the first light shield layer is deposited, and when the first light shield layer is deposited, the first light shield layer also be formed in the side wall formation trench to form the light shield side wall connected to the conductive layer in the side wall formation trench.

When the first light shield layer is directly connected to the second light shield layer, the first light shield layer may be formed in the side wall formation trench reaching the bottom thereof.

In manufacturing the electrooptical device in this arrangement, a second light shield layer, an underlayer insulator, a semiconductor layer forming the thin-film transistor, a gate insulator of the thin-film transistor, and a gate electrode of the thin-film transistor are deposited on the surface of the first substrate, prior to formation of the thin-film transistor on the surface of the first substrate. The interlayer insulator is deposited on the gate electrode. The side wall formation trench is formed in the interlayer insulator, the gate insulator, and the underlayer insulator, running by the channel region of the thin-film transistor and reaching the second light shield layer. Subsequently, the first light shield layer is then deposited, and when the first light shield layer is deposited, the first light shield layer also be formed in the side wall formation trench to form the light shield side wall connected to the second light shield layer in the side wall formation trench.

To resolve the previously described problem, a second electrooptical device of the present invention can include, above a substrate, a pixel electrode, a thin-film transistor connected to the pixel electrode, a wiring connected to the thin-film transistor, and a light shield member three-dimensional covering the thin-film transistor and the wiring.

In the second electrooptical device of the present invention, the thin-film transistor connected to the pixel electrode performs switching control, thereby driving the pixel in an active-matrix driving method. The light shield layer three-dimensionally covers the thin-film transistor. The light shield member prevents light rays entering the substrate vertically or obliquely from above, returning light rays entering the substrate vertically or obliquely from below, and internally reflected light or multiple reflected light in response to these light rays from entering the channel region of the thin-film transistor and the adjacent area of the channel region. The light shield member accurately defines the non-aperture area of each pixel in a grid configuration.

As a result, the second electrooptical device of the present invention increases light tightness, and allows a thin-film transistor with reduced photocurrent leakage to perform correctly switching control on a pixel electrode under severe operational conditions in which high-intensity light and returning light are present. The present invention thus presents a bright and high-contrast image.

In view of such technical effects, the light shield member three-dimensionally covering the thin-film transistor and the wiring, in a narrow sense, can mean a light shield member defining a three-dimensionally closed space which contains the thin-film transistor and the wiring, and in a broader sense, can mean a light shield member defining a three-dimensionally closed space with a slight opening or discontinuity which contains the thin-film transistor and the wiring as long as the light shield member blocks (reflects or absorbs) light coming in three-dimensionally from various directions to some degree.

In another embodiment of the second electrooptical device of this invention, the light shield member can include one light shield layer deposited on the bottom surface and the side wall of a trench formed in the substrate and accommodating the thin-film transistor and the wiring, and another light shield layer covering the trench from above.

In this arrangement, the trench is formed in the substrate, and the one light shield layer is deposited on the bottom surface and the side wall of the trench. The thin-film transistor and the wiring are placed in the trench in a manner that the thin-film transistor and the wiring are insulated from each other with an interlayer insulator interposed therebetween or are insulated from the one light shield layer. Another light shield layer covers the trench from above. With a relatively simple construction and manufacturing process, the thin-film transistor and the wiring are three-dimensionally shielded from light.

In yet another embodiment of the second electrooptical device of the present invention, the light shield member can include a lower light shield layer deposited above the substrate, an upper light shield layer deposited above the thin-film transistor and the wiring, formed on the lower light shield layer, and a side wall light shield layer filling a groove formed from the upper light shield layer to the lower light shield layer outside the thin-film transistor and the wiring in a plan view.

In this embodiment, the thin-film transistor and the wiring are arranged between the lower light shield layer and the upper light shield layer in a manner that the thin-film transistor and the wiring are insulated from each other with an interlayer insulator interposed therebetween or are insulated from the lower light shield layer and the upper light shield layer. The groove can be formed in the interlayer insulator outside the thin-film transistor and the wiring, for example, extending from the upper light shield layer to the lower light shield layer, and the side wall light shield layer fills the trench. With a relatively simple construction and manufacturing process, the thin-film transistor and the wiring are three-dimensionally shielded from light.

In another embodiment of the second electrooptical device of this invention, the light shield member can include in one plane area thereof, one light shield layer deposited on the bottom surface and the side wall of a trench formed in the substrate and accommodating the thin-film transistor and the wiring, and another light shield layer covering the trench from above, and in another plane area, a lower light shield layer deposited on the substrate, an upper light shield layer deposited on the thin-film transistor and the wiring, formed on the lower light shield layer, and a side wall light shield layer filling a groove formed from the upper light shield layer to the lower light shield layer outside the thin-film transistor and the wiring in a plan view.

In this embodiment, a relatively wide trench can be formed in the one plane area, and the one light shield layer is deposited on the bottom surface and the side wall of the trench. The thin-film transistor and the wiring are arranged within the trench in a manner that the thin-film transistor and the wiring are insulated from each other with an interlayer insulator interposed therebetween or are insulated from the one light shield layer. Another light shield layer covers the trench from above. In another area, the thin-film transistor and the wiring are arranged between the lower light shield layer and the upper light shield layer in a manner that the thin-film transistor and the wiring are insulated from each other with an interlayer insulator interposed therebetween or are insulated from the lower light shield layer and the upper light shield layer. A relatively narrow groove is formed in the interlayer insulator outside the thin-film transistor and the wiring, extending from the upper light shield layer to the lower light shield layer, and the side wall light shield layer fills the groove. With a relatively simple construction and manufacturing process, the thin-film transistor and the wiring are reliably three-dimensionally shielded from light. By changing the material of the light shield member from area to area, more flexibility can be provided in device design.

In another embodiment of the second electrooptical device of this invention, the light shield member can include one light shield layer deposited on the bottom surface and the side wall of a trench formed in the substrate and partly accommodating the thin-film transistor and the wiring, an upper light shield layer deposited above the thin-film transistor and the wiring formed above the one light shield layer, and a side wall light shield layer filling a groove formed from the upper light shield layer to the one light shield layer outside the thin-film transistor and the wiring in a plan view.

In this embodiment, a relatively wide trench is formed in the substrate, and the one light shield layer is deposited on the bottom surface and the side wall of the trench, and the thin-film transistor and the wiring are partly accommodated in the trench. The thin-film transistor and the wiring are accommodated in the trench in a manner that the thin-film transistor and the wiring are insulated from each other with an interlayer insulator interposed therebetween or are insulated from the one light shield layer so that a part of the thin-film transistor and the wiring is set to be higher in level than the edge of the trench with respect to the substrate. The upper light shield layer is arranged on the thin-film transistor and the wiring partly accommodated in the trench. A relatively narrow groove is formed from the upper light shield layer to the one light shield layer outside the thin-transistor and the wiring, and the side wall light shield layer fills the groove. With a relatively simple construction and manufacturing process, the thin-film transistor and the wiring are reliably three-dimensionally shielded from light. By fabricating the light shield member of a plurality of light shield layers, more flexibility is provided in device design.

To resolve the above-referenced problem, a third electrooptical device of the present invention can include a pair of first and second substrates with an electrooptical material interposed therebetween, and above the first substrate, a plurality of pixel electrodes arranged two-dimensionally including a first pixel electrode group which is driven in an alternating driving method with a first period and a second pixel electrode group which is driven in an alternating driving method with a second period complimentary to the first period, a thin-film transistor connected to each pixel electrode, a wiring connected to each thin-film transistor, and a light shield member which covers the thin-film transistor and the wiring in a gap area between adjacent pixel electrodes in a plan view and protrudes in a ridge a portion of the gap area between adjacent pixel electrodes of different pixel electrode groups, and further includes above the second substrate, a counter electrode facing the plurality of pixel electrodes.

In accordance with the third electrooptical device of the present invention, the thin-film transistor connected to the pixel electrode performs switching control on the pixel electrode in an active matrix driving method. The first pixel electrode group is driven in an alternating driving method with the first period while the second pixel electrode group is driven in an alternating driving method with the second period which is complementary to the first period. In this way, the electrooptical device may be driven in a scanning line alternating driving method, in which the driving voltage to each pixel is alternated in polarity every scanning line, or may be driven in a data line alternating driving method, in which the driving voltage to each pixel is alternated in polarity every data line, or may be driven in a dot alternating driving method, in which the driving voltage to each pixel is alternated in polarity every pixel. The use of the line alternating driving method serves the purpose of controlling degradation of the electrooptical material caused by the application of a direct current voltage. Furthermore, crosstalk and flickering are also controlled on a presented display image. The light shield layer three-dimensionally covers the thin-film transistor and the wiring in the gap area between the adjacent pixel electrodes. The light shield member prevents light rays entering the substrate vertically or obliquely from above, returning light rays entering the substrate vertically or obliquely from below, and internally reflected light or multiple reflected light in response to these light rays from entering the channel region of the thin-film transistor and the adjacent area of the channel region. The light shield member accurately defines the non-aperture area of each pixel in a grid configuration.

The light shield member protrudes in a ridge a portion of the gap area between adjacent pixel electrodes of different pixel electrode groups. When the electrooptical device is driven in one of the line alternating driving methods, a transverse electric field taking place between the adjacent pixel electrodes of different driving voltage polarities is relatively weakened. If a transverse electric field occurs between the adjacent pixel electrodes in the electrooptical device, which is typically driven by a longitudinal electric field between each pixel electrode and the counter electrode, an operational fault is created in the electrooptical material, such as a orientation defect of the liquid crystal. In accordance with the present invention, the light shield member shortens the distance between the pixel electrode and the counter electrode in the area where such a transverse electric field takes place, thereby intensifying the longitudinal electric field in this area and relatively weakening the adverse effect of the transverse electric field in the same area.

As a result, the third electrooptical device of the present invention increases light tightness and allows a thin-film transistor with reduced photocurrent leakage thereof to perform correctly switching control on the pixel electrode under severe operational conditions in which high-intensity light and returning light are present. The present invention adopts the line alternating driving method, which is effective in lengthening the life of the electrooptical material and reducing flickering. The present invention thus presents a bright and high-contrast image.

In accordance with the third electrooptical device of the present invention, the light shield member includes, in an area between adjacent pixel electrodes of the same pixel electrode group, one light shield layer deposited on the bottom surface and the side wall of a trench formed in the substrate and accommodating the thin-film transistor and the wiring and another light shield layer covering the trench from above. The light shield member also includes, in an area between adjacent pixel electrodes of the different pixel electrode groups, a lower light shield layer deposited on the substrate, an upper light shield layer deposited on the thin-film transistor and the wiring, formed on the lower light shield layer, and a side wall light shield layer filling a groove formed from the upper light shield layer to the lower light shield layer outside the thin-film transistor and the wiring in a plan view.

In this embodiment, a relatively wide trench is formed in the first substrate in the gap area between the pixels where no transverse electric field takes place, and the one light shield layer is deposited on the bottom surface and the side wall of the trench. The thin-film transistor and the wiring are accommodated in the trench in a manner that the thin-film transistor and the wiring are insulated from each other with an interlayer insulator interposed therebetween or are insulated from the one light shield layer. Another light shield layer covers the trench from above. In the gap area between the pixel electrodes where a transverse electric field takes place, the thin-film transistor and the wiring are arranged between the lower light shield layer and the upper light shield layer in a manner that the thin-film transistor and the wiring are insulated from each other with an interlayer insulator interposed therebetween or insulated from the lower and upper light shield layers.

A relatively narrow groove is formed in the interlayer insulator outside the thin-film transistor and the wiring, extending from the upper light shield layer to the lower light shield layer. The side wall light shield layer fills the groove. In the gap area where the transverse electric field takes place, the presence of the light shield member causes the ridge in a localized position, thereby weakening the adverse effect of the transverse electric field. At the same time, in the gap area where no transverse electric field takes place, the presence of the light shield member causes no ridge, thereby reducing the operational fault due to the orientation defect of the liquid crystal, which may be caused by a step at the underlayer beneath the pixel electrode on the first substrate in contact with the electrooptical material.

In another embodiment, a planarizing process is performed on the underlayer beneath the pixel electrode in the area between the adjacent pixel electrodes of the same pixel electrode group.

In this arrangement, the light shield member is arranged in the gap area where no transverse electric field is generated, but the underlayer of the pixel electrode is subjected to the planarizing process. For example, the planarizing process is performed by using a CMP (Chemical Mechanical Polishing) process, or a spin coating process, or by changing the depth of the trench which accommodates the thin-film transistor and the wiring. As a result, in the gap area where no transverse electric field is generated, the operational fault such as the orientation defect of the liquid crystal, which may be caused by a step at the underlayer of the pixel electrode in contact with the electrooptical material, is substantially reduced.

In the second and third electrooptical devices of the present invention, in which the light shield member includes the side wall light shield layer, the upper light shield layer and the lower light shield layer may be integrally formed. In this arrangement, with a relatively simple construction and manufacturing process, a highly reliable light shield layer is formed. After forming the groove in the interlayer insulator which is laminated subsequent to the thin-film transistor or the wiring, the upper light shield layer may fill the groove.

In another embodiment of the second and third electrooptical devices of the present invention, the pixel electrode and the thin-film transistor are connected to each other through a conductive layer having a light shield property. In this embodiment, a contact hole is opened, for example, and light ingress is reliably prevented at the junction point between the pixel electrode and the thin-film transistor, where an internal space enclosed by the light shield member is likely to suffer from light ingress from outside.

In another embodiment of the second and third electrooptical devices of the present invention, the junction point between the pixel electrode and the thin-film transistor is positioned, at the center of adjacent thin-film transistors in a plan view. Even if light enters through the junction point, for example the contact hole, between the pixel electrode and the thin-film transistor into the internal space enclosed by the light shield member, the light ingress point is spaced from each thin-film transistor along the surface of the substrate. Accordingly, stray light reaching the channel region of the thin-film transistor and the adjacent area thereof is substantially reduced.

In another embodiment of the second and third electrooptical devices of the present invention, the electrooptical device includes a light shield layer facing the substrate and facing the junction point between the pixel electrode and the thin-film transistor. In this embodiment, a contact hole is opened, for example, and light ingress is reliably prevented at the junction point between the pixel electrode and the thin-film transistor, where an internal space enclosed by the light shield member is likely to suffer from light ingress from outside.

In another embodiment of the second and third electrooptical devices of the present invention, the light shield member can be formed of a film containing a refractory metal. In this embodiment, the light shield member is formed of a single metal layer, an alloy layer, a metal silicide layer, a polysilicide layer, or a multilayer of these layers, each of which layer is fabricated of at least one of the refractory metals such as Ti (titanium), Cr (chromium), W (tungsten), Ta (tantalum), Mo (molybdenum), and Pb (lead). The light shield member thus provides high light-shield performance.

In another embodiment of the second and third electrooptical devices of the present invention, the wiring can include scanning lines and data lines intersecting each other, and the light shield member is configured in a grid in a plan view. In this embodiment, the scanning lines and the data lines intersect each other in a grid configuration in an image display area. The light shield member having a grid configuration three-dimensionally covers the grid configuration of the scanning lines and the data lines. This arrangement reduces the possibility that light strays into the thin-film transistors connected to the scanning lines and the data lines through the vicinity of each of the scanning lines and the data lines.

In another embodiment of the second and third electrooptical devices of the present invention, the electrooptical device can further include a storage capacitor formed in a space three-dimensionally covered with the light shield member on the first substrate, and connected to the pixel electrode. In this embodiment, the storage capacitor is formed within a space three-dimensionally enclosed by the light shield member. The storage capacitor prevents light shield performance from dropping while adding a capacitance to the pixel electrode. The voltage holding capability of each pixel electrode is thus increased.

To resolve the previously described object, a projection-type display apparatus can include a light valve including one of the first, second, and third electrooptical devices as mentioned above (and the modifications thereof), a light source for directing light to the light valve, and an optical system for projecting a light beam from the light valve.

In the projection-type display apparatus of the present invention, the light source directs light to the light valve, and the optical system projects a light beam from the light valve to a screen. The light valve can be formed of one of the first, second, and third electrooptical devices. With the above-discussed high lightshield performance, the thin-film transistor with reduced photocurrent leakage thereof reliably performs switching control on the pixel electrode under a high-intensity projection light beam. As a result, the present invention thus presents a bright and high-contrast image.

These operations and other advantages of the present invention will become more apparent from the following discussion of the embodiments.

BRIEF DESCRIPTION OF THE DRAWINGS

The invention will be described with reference to the accompanying drawings, in which like elements are referred to with like numbers, and in which:

FIG. 23 is a plan view of a plurality of pixel electrodes diagrammatically showing the relationship between the polarity of a driving voltage in each pixel electrode and a generation area of a transverse electric field in an electrooptical device of a sixth embodiment of the present invention in a scanning line alternating driving operation;

DETAILED DESCRIPTION OF PREFERRED EMBODIMENTS

The best mode for carrying out the present invention is now discussed, referring to the embodiments together with the drawings. In each of the following embodiments, the electrooptical device of the present invention is employed in a liquid crystal device.

An electrooptical device of the first embodiment is now discussed, referring to FIG. 1 through FIG. 16.

The construction and operation of the electrooptical device of the present invention are discussed, referring to FIG. 1 through FIG. 9. As shown, layers and members are not necessarily drawn to equal scale to show the layers and members in easy-to-identify sizes.

Figure 1:
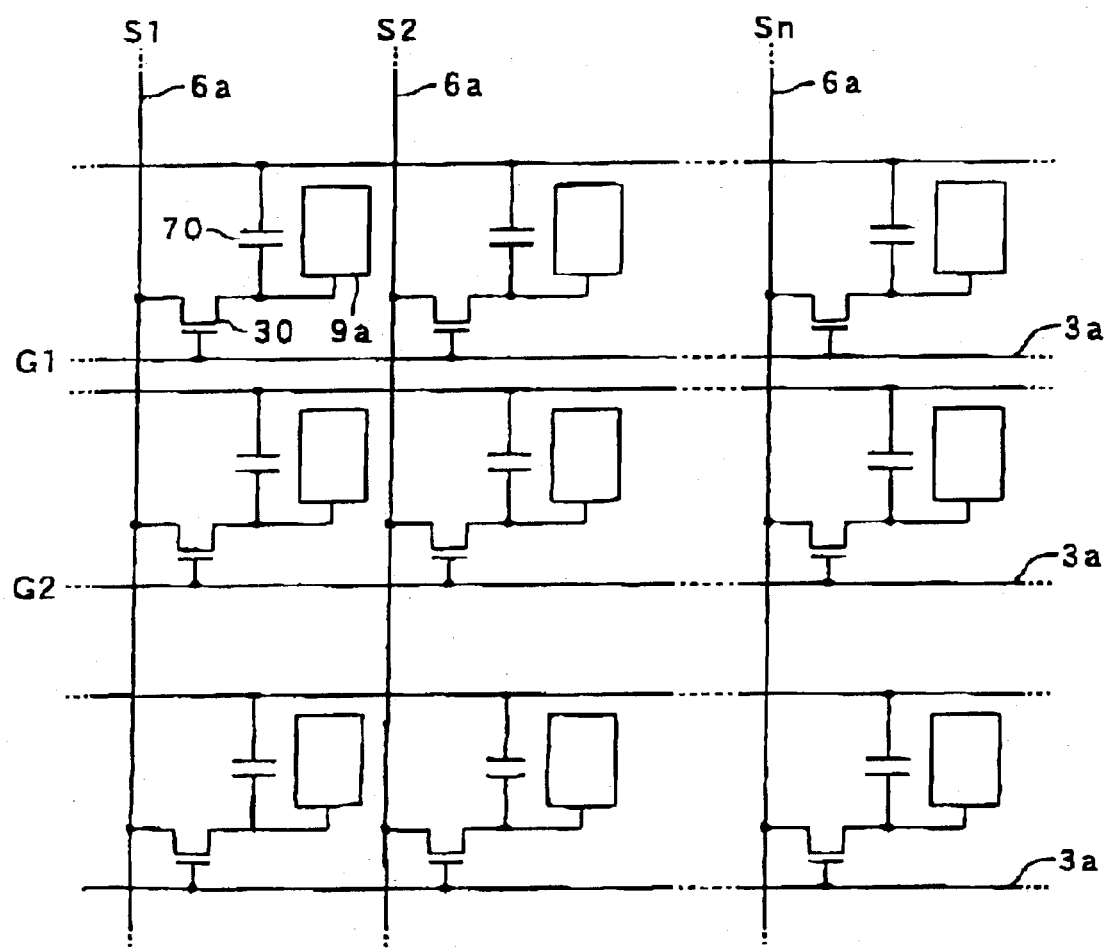
FIG. 1 is an equivalent circuit diagram of a variety of elements and wiring formed in each of a plurality of pixels arranged in a matrix in the electrooptical device in accordance with the present invention.

Referring to FIG. 1., each of a plurality of pixels arranged in a matrix forming an image display area of the electrooptical device of this embodiment includes pixel electrodes 9a and TFT 30s for controlling the pixel electrodes 9a, and data lines 6a for supplying image signals are electrically connected to the sources of the TFT 30s. Image signals S1, S2, . . . , Sn may subsequently be supplied to the data lines 6a on one line at a time basis or may be supplied to a plurality of adjacent data lines 6a on a group by group basis. Scanning lines 3a are respectively electrically connected to the gates of the TFTs 30, and are supplied with scanning signals G1, G2, . . . , Gm in a pulse form, in this order, on one line at a time basis. The pixel electrodes 9a are electrically connected to the drains of the TFTs 30, and turn on the TFTs 30 as switching elements for a predetermined period, thereby writing the image signals S1, S2 . . . , Sn supplied from the data lines 6a, in each pixel at a predetermined timing. The image signals S1, S2, . . . , Sn at a predetermined level written through pixel electrodes 9a on the liquid crystal as one example of electrooptical material are held with respect to a counter electrode formed on a counter substrate, to be discussed later.

The electrooptical device modulates light to present a gradation display by changing the orientation or order of a set of molecules with an applied voltage level. In the normally white mode, transmittance ratio to incident light drops in response to the applied voltage while in the normally black mode, the transmittance ratio to the incident light rises in response to the applied voltage. The liquid-crystal display device outputs light having a contrast responsive to the image signal.

To prevent the stored image signal from being leaked, a storage capacitor 70 may be added in parallel with a capacitance of the liquid crystal formed between the pixel electrode 9a and the counter electrode. For example, the voltage at the pixel electrode 9a is maintained by the storage capacitor 70 for a period of time three orders of magnitude longer than the period throughout which the source voltage is applied. The voltage holding characteristic of the pixel is thus improved, and a high-contrast electrooptical device 100 can be achieved.

Figure 2:
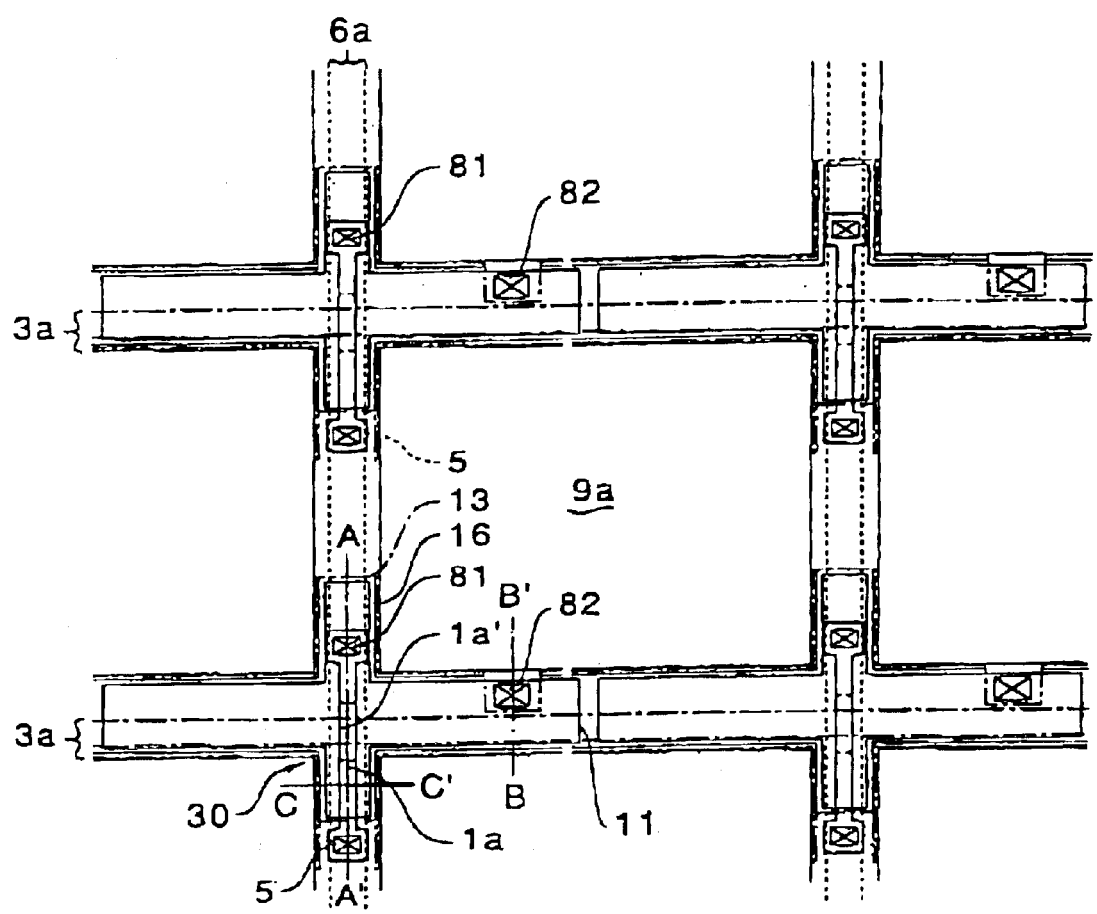
FIG. 2 is a plan view showing a plurality of pixel groups adjacent to each other in a TFT array substrate in which a data line, a scanning line, a pixel electrode, and a light shield layer are formed in the electrooptical device of FIG. 1.
Figure 3:
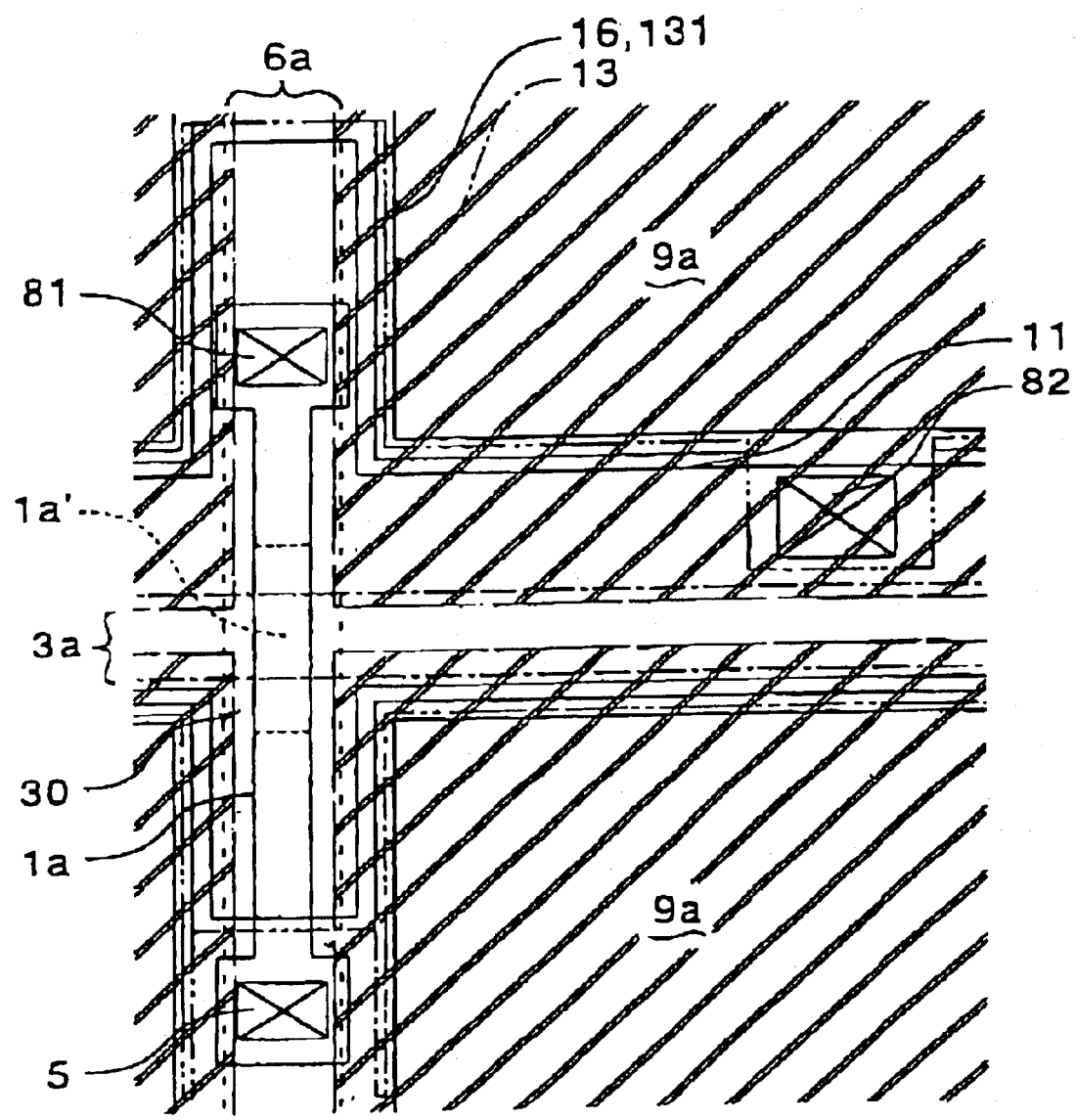
FIG. 3 is an enlarged view showing the formation area of the pixels in the TFT array substrate of FIG. 2.

Referring to FIG. 2, the TFT array substrate of the electrooptical device includes a matrix of transparent pixel electrodes 9a in each pixel. The formation area of the pixel electrode 9a is a rectangular area hatched with upwardly inclined lines in an enlarged view in FIG. 3.

The data line 6a and the scanning line 3a run vertically and horizontally, respectively, along the border area of each pixel electrode 9a, but unlike conventional electrooptical devices, no dedicated capacitive lines are formed.

Figure 4:
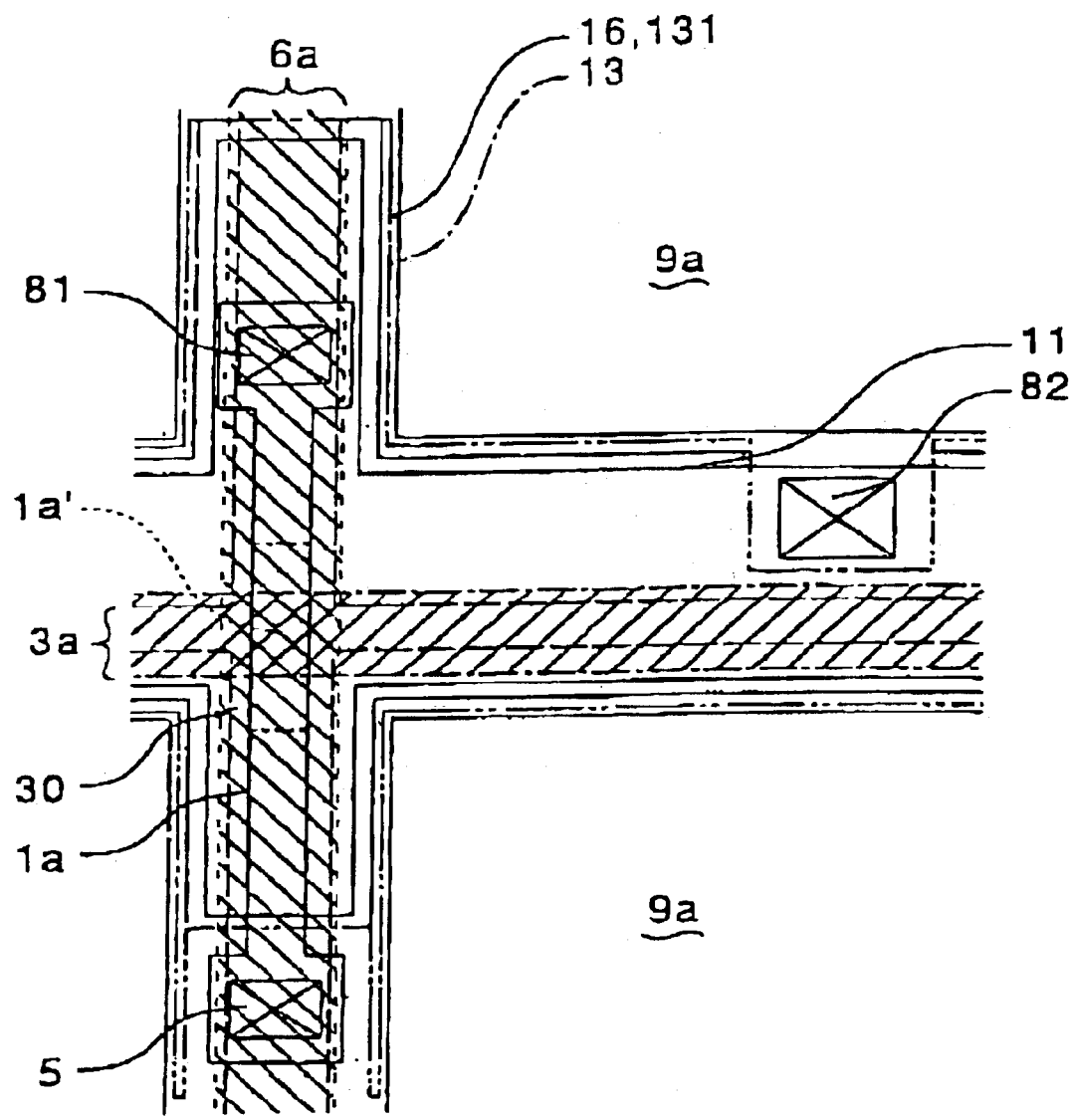
FIG. 4 is an enlarged view showing the formation area of the scanning line and the data line in the TFT array substrate of FIG. 2.

The formation area of the data line 6a is represented by an area hatched with downwardly inclined lines in the enlarged view in FIG. 4. Both edge portions of the data line 6a overlap the edge of each pixel electrode 9a. The formation area of the scanning line 3a is represented by an area hatched with upwardly inclined lines in the enlarged view in FIG. 4, and both edge portions of the scanning line 3a overlap the edge of each pixel electrode 9a.

In this embodiment, the data line 6a is electrically connected to the source region, to be discussed later, of a semiconductor layer 1a formed of a polysilicon layer through a contact hole 5. The pixel electrode 9a is electrically connected to the drain region, to be discussed later, of the semiconductor layer 1a through contact holes 81 and 82. The scanning line 3a (a gate electrode) runs facing the channel formation region, to be discussed later, of the semiconductor layer 1a.

Figure 5:
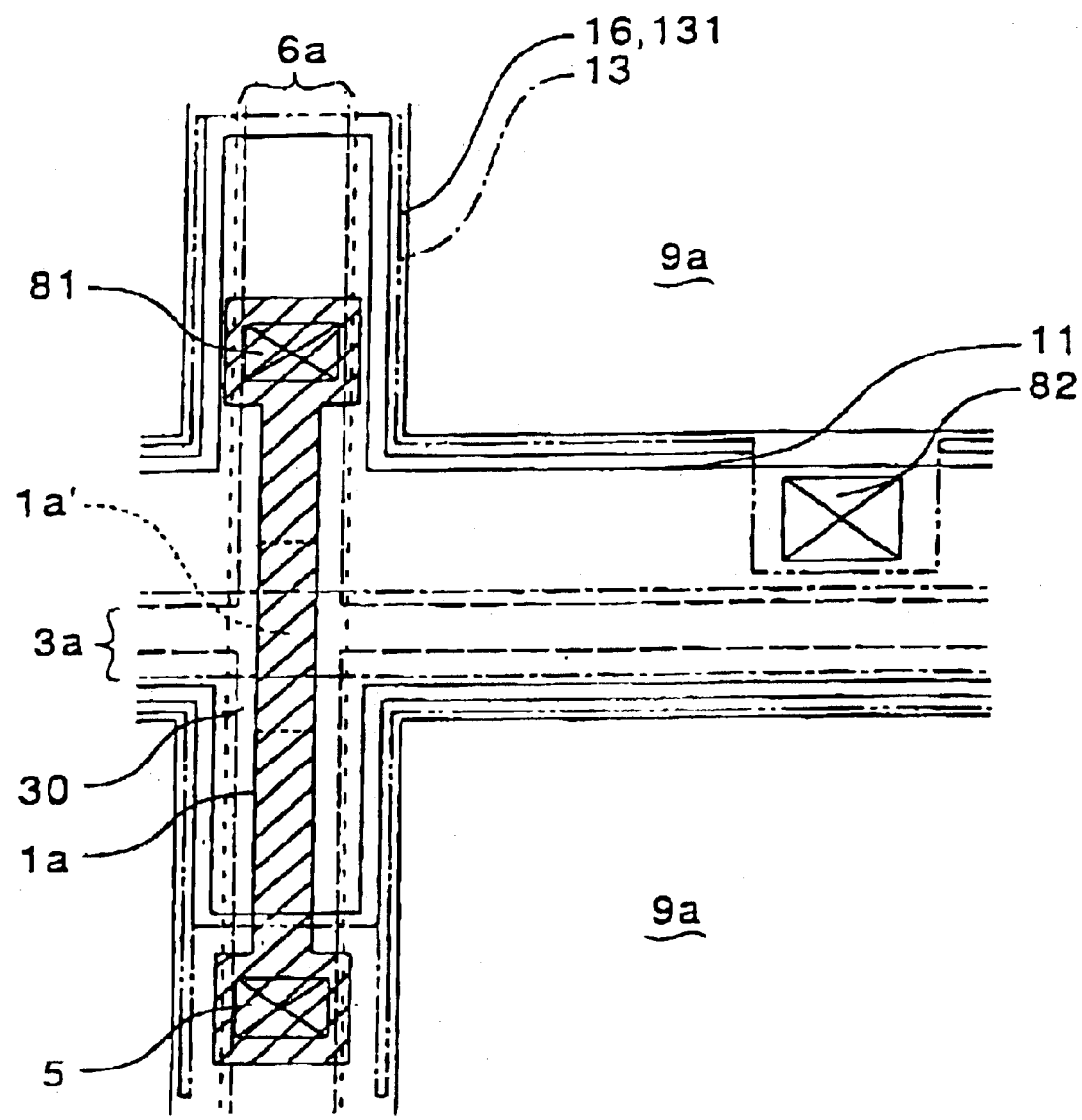
FIG. 5 is an enlarged view showing the formation area of a semiconductor layer for forming a TFT in the TFT array substrate of FIG. 2.

The formation area of the semiconductor layer 1a is represented by an area hatched with upwardly inclined lines in the enlarged view in FIG. 5.

In this embodiment, the data line 6a can be formed of a conductive layer having a light shield property and extending in a line having an equal line width, such as a metal layer of aluminum and an alloy layer of metal silicide. The semiconductor layer 1a is formed beneath the data line 6a and within the formation area of the data line 6a. Specifically, the semiconductor layer 1a is arranged in the border area running vertically and horizontally between the pixel electrodes 9a.

Figure 6:
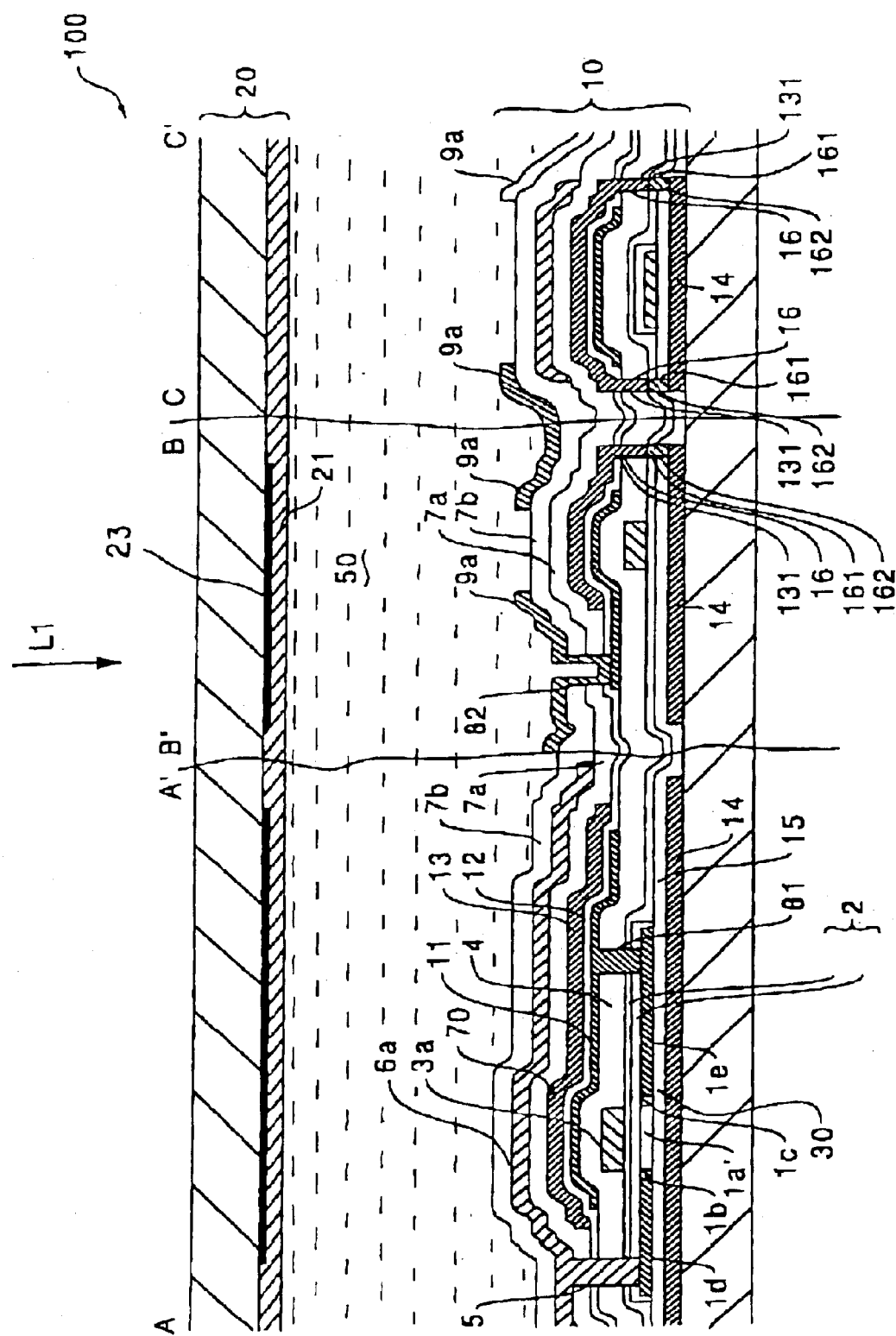
FIG. 6 is a cross-sectional view showing the TFT array substrate taken along line A–A', line B–B', and line C–C' in FIG. 2.

Referring to FIG. 6, the electrooptical device 100 includes a TFT array substrate 10 (a first substrate) and a counter substrate 20 (a second substrate) opposed to the TFT array substrate 10. The TFT array substrate 10 is fabricated of a quartz substrate, for instance, and the counter substrate 20 is fabricated of a glass substrate or a quartz substrate, for instance. The TFT array substrate 10 is provided with the pixel electrodes 9a, and arranged on top of them is an alignment layer (not shown) which has been subjected to a predetermined alignment process such as a rubbing process. The pixel electrode 9a is fabricated of a transparent conductive thin film, such as an ITO (Indium Tin Oxide) film. The alignment layer is fabricated of an organic thin film, such as a polyimide thin film.

The TFT array substrate 10 includes a pixel switching TFT 30 for performing switching control of each pixel electrode 9a, formed right below the data line 6a. The TFT 30 has an LDD (Lightly Doped Drain) structure and includes the scanning line 3a (the gate electrode), the channel region 1a' of the semiconductor layer 1a in which a channel is formed by the electric field of the scanning signals supplied from the scanning line 3a, a dual-structured gate insulator 2 for insulating the scanning line 3a from the semiconductor layer 1a, the data line 6a (a source electrode), the lightly doped source region 1b (a source LDD region) and the lightly doped drain region 1c (a drain LDD region) of the semiconductor layer 1a, and the heavily doped source region 1d and the heavily doped drain region 1e of the semiconductor layer 1a. A corresponding one of the plurality of pixel electrodes 9a is electrically connected to the heavily doped drain region 1e.

The source regions 1b and 1d as well as the drain regions 1c and 1e are doped with a n-type dopant or a p-type dopant, depending on which of the two channels, a n-channel or a p-channel, is produced in the semiconductor layer 1a. The n-channel TFT provides a fast operational speed and is frequently used as a pixel switching TFT.

The TFT 30 preferably has the above-mentioned LDD structure. Alternatively, the TFT 30 may have an offset structure in which no impurity ion implantation is performed on the regions corresponding to the lightly doped source region 1b and the lightly doped drain region 1c. The TFT 30 may also have a self-aligned type TFT in which a high dose impurity ion is implanted with a part of the gate electrode 3a being used as a mask, to form heavily doped source and drain regions in a self-alignment process. In this embodiment, the gate electrode (the data line 3a) of the TFT 30 is of a single gate structure in which a gate electrode is interposed between the source and drain regions 1b and 1e, but alternatively, more than one gate electrode may be interposed therebetween. In this case, the same signal is applied to the gate electrodes. With dual gates (double gates) or triple gates employed in a TFT, photocurrent leakage at junctions between the channel region and the source region as well as between the channel region and the drain region are prevented, and thereby a current during off period is reduced. If at least one of the gate electrodes has a LDD structure or an offset structure, the off current is reduced even more, and a reliable switching element can be achieved.

In this embodiment, the data line 6a (the source electrode) can be formed of a metal layer of aluminum, or an alloy layer of metal silicide.

Arranged over the scanning line 3a (the gate electrode) and the gate insulator 2 is a first interlayer insulator 4 through which a contact hole 5 leading to the heavily doped source region 1d and a contact hole 81 leading to the heavily doped drain region 1e are formed. A second interlayer insulator 7a is arranged over the interlayer insulator 4, and a third interlayer insulator 7b is formed over the second interlayer insulator 7a. The data line 6a (the source electrode) is formed on the second interlayer insulator 7a, and is electrically connected to the heavily doped source region 1d through the contact hole 5.

The pixel electrode 9a is formed on the third insulator 7b. In this embodiment, to electrically connect the pixel electrode 9a to the heavily doped drain region 1e of the TFT 30, a drain electrode 11 is formed on the surface of the first interlayer insulator 4. The drain electrode 11 is electrically connected to the heavily doped drain region 1e of the TFT 30 through the contact hole 81 in the first interlayer insulator 4. A contact hole 82 is drilled through the second interlayer insulator 7a and the third interlayer insulator 7b, and the pixel electrode 9a is thus electrically connected to the drain electrode 11 through the contact hole 82. The pixel electrode 9a is electrically connected to the heavily doped drain region 1e of the TFT 30 through the drain electrode 11.

In this embodiment, the drain electrode 11 is fabricated of a conductive layer having a light shield property, such as a doped silicon layer (a polysilicon intermediary electrode) which is formed to fully cover the heavily doped drain region 1e and the channel region 1a from above. As represented by an area hatched with upwardly inclined lines in FIG. 7, the formation area of the drain electrode 11 extends along the data line 6a and the scanning line 3a in a cross configuration in the border area of each pixel electrode 9a from the intersection of the data line 6a and the scanning line 3a.

Referring to FIG. 6, in this embodiment, a thin insulator 12 can be deposited on the top surface of the drain electrode 11, and a first light shield layer 13 is laminated between the thin insulator 12 and the second interlayer insulator 7a, covering the channel region 1a' of the TFT 30. In this embodiment, the first light shield layer 13 is formed of a metal layer, an alloy layer, a metal silicide layer, each of which layers contains at least either one of titanium, chromium, tungsten, tantalum, molybdenum, palladium, and aluminum, or a conductive layer having a light shield property such as a doped silicon. The formation area of the first light shield layer 13 is represented by an area hatched with downwardly inclined lines in FIG. 8. The first light shield layer 13 extends vertically and horizontally along the border area of each pixel electrode 9a in a grid configuration, and is held at a potential common to the pixels.

The drain electrode 11 is formed below the first light shield layer 13, and the drain electrode 11 and the first light shield layer 13 are opposed to each other over a wide area with the thin insulator 12 interposed therebetween. In this embodiment, the thin insulator 12 is used as a dielectric layer, and the storage capacitor 70 having the first light shield layer 13 and the drain electrode 11 as the electrodes thereof is thus provided.

In this embodiment, referring to FIG. 6, a second light shield layer 14 is formed on the TFT array substrate 10 in such a manner that the second light shield layer 14 covers the channel region 1a' of the TFT 30 from below. The underlayer insulator 15 is deposited on the top surface of the second light shield layer 14. The formation area of the second light shield layer 14 is represented by an area hatched with downwardly inclined lines in FIG. 9.

Figure 8:
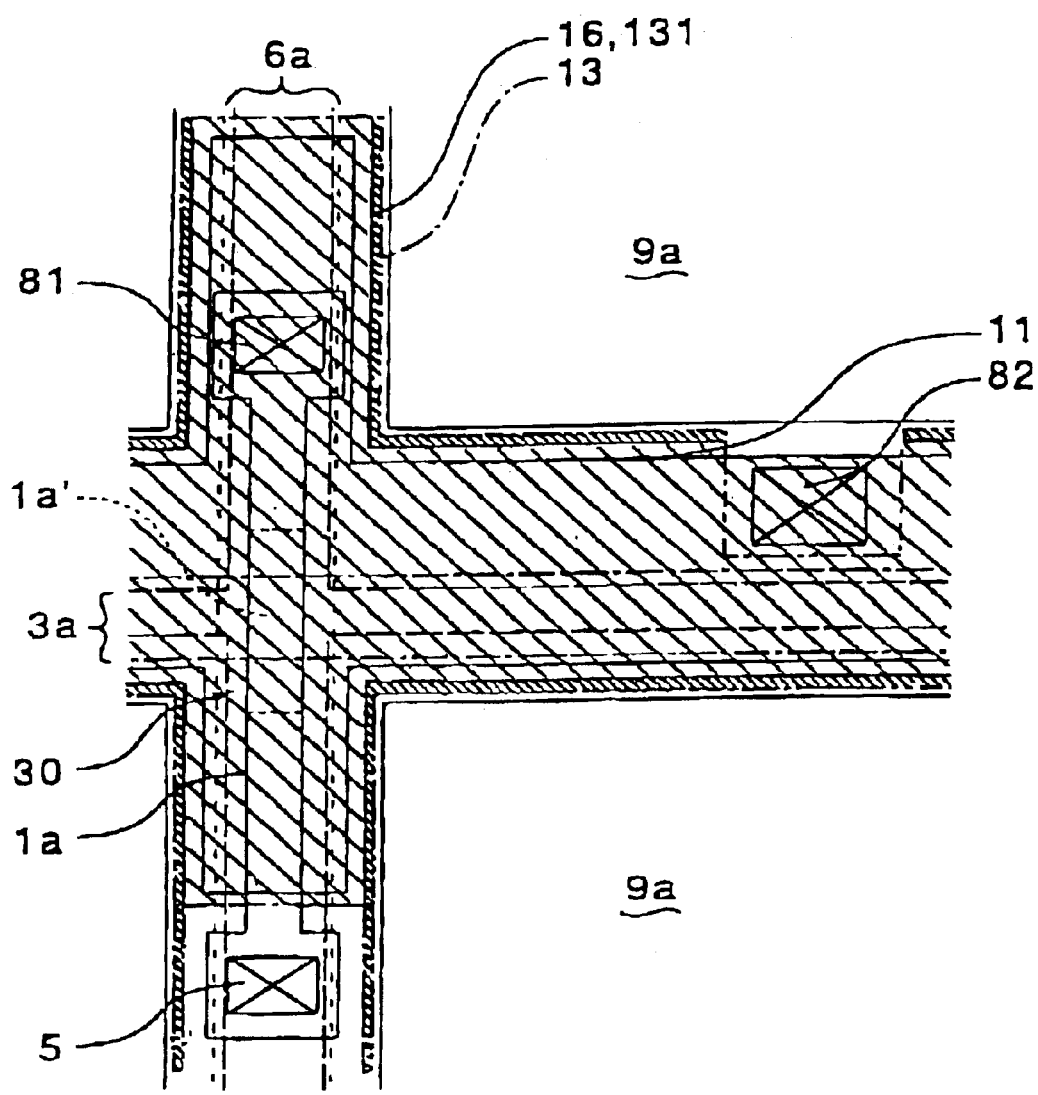
FIG. 8 is an enlarged view showing a first light shield layer and the formation area of a side wall formation trench in the TFT array substrate of FIG. 2.
Figure 9:
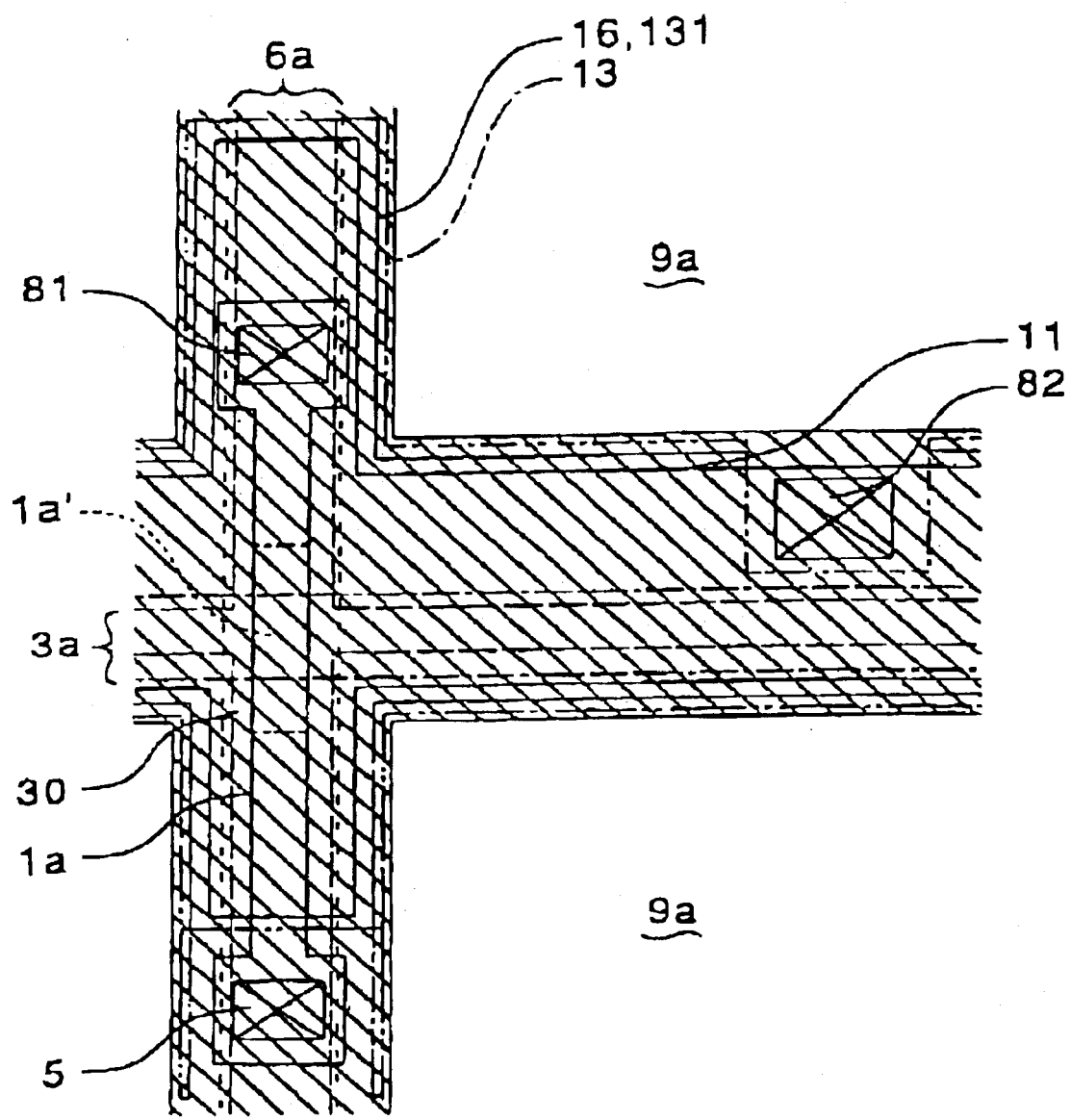
FIG. 9 is an enlarged view showing the first light shield layer and the formation area of the side wall formation trench in the TFT array substrate of FIG. 2.
Figure 10:
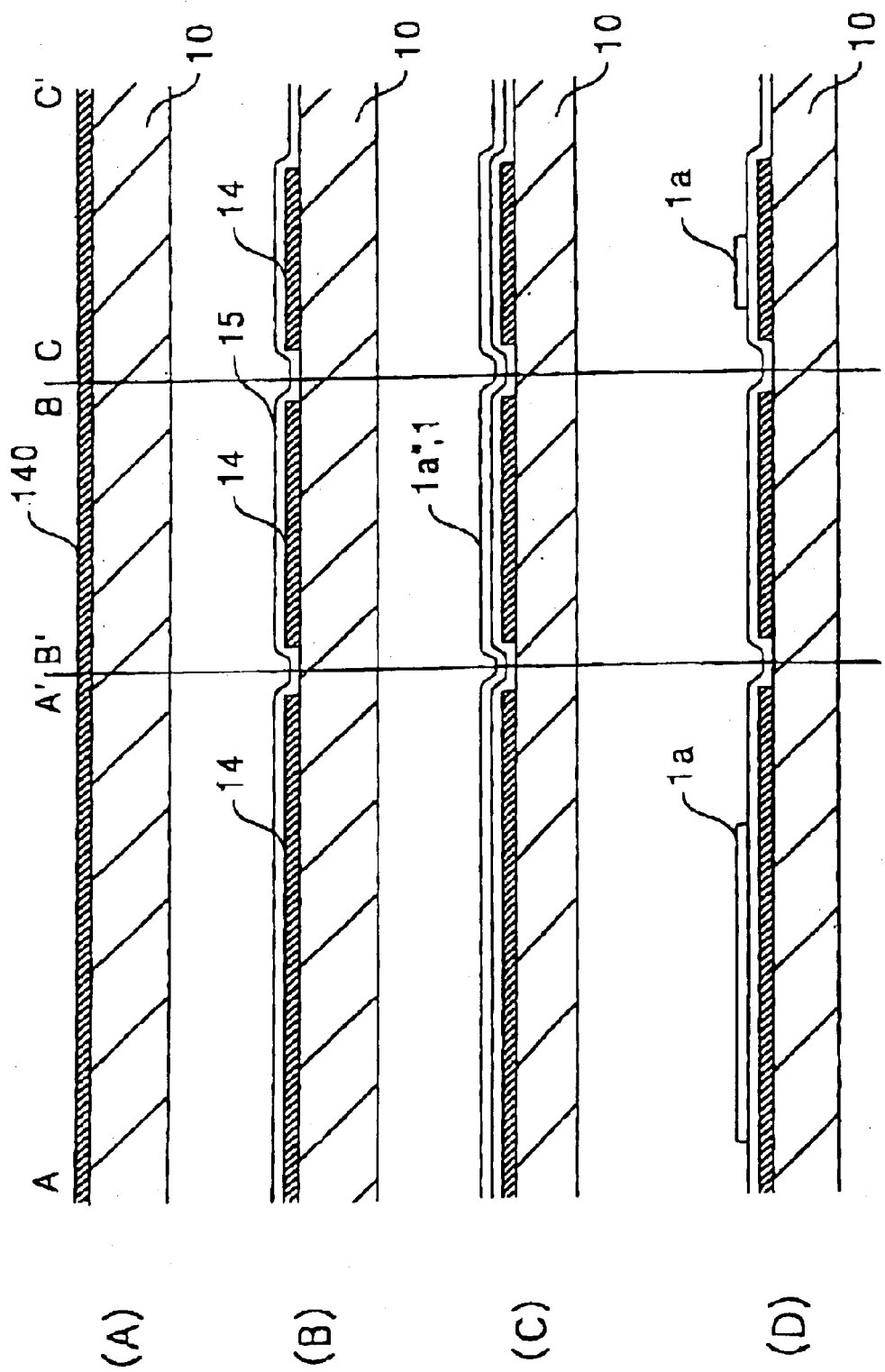
FIG. 10 is a cross-sectional view showing a process of manufacturing the TFT array shown in FIG. 2.
Figure 11:
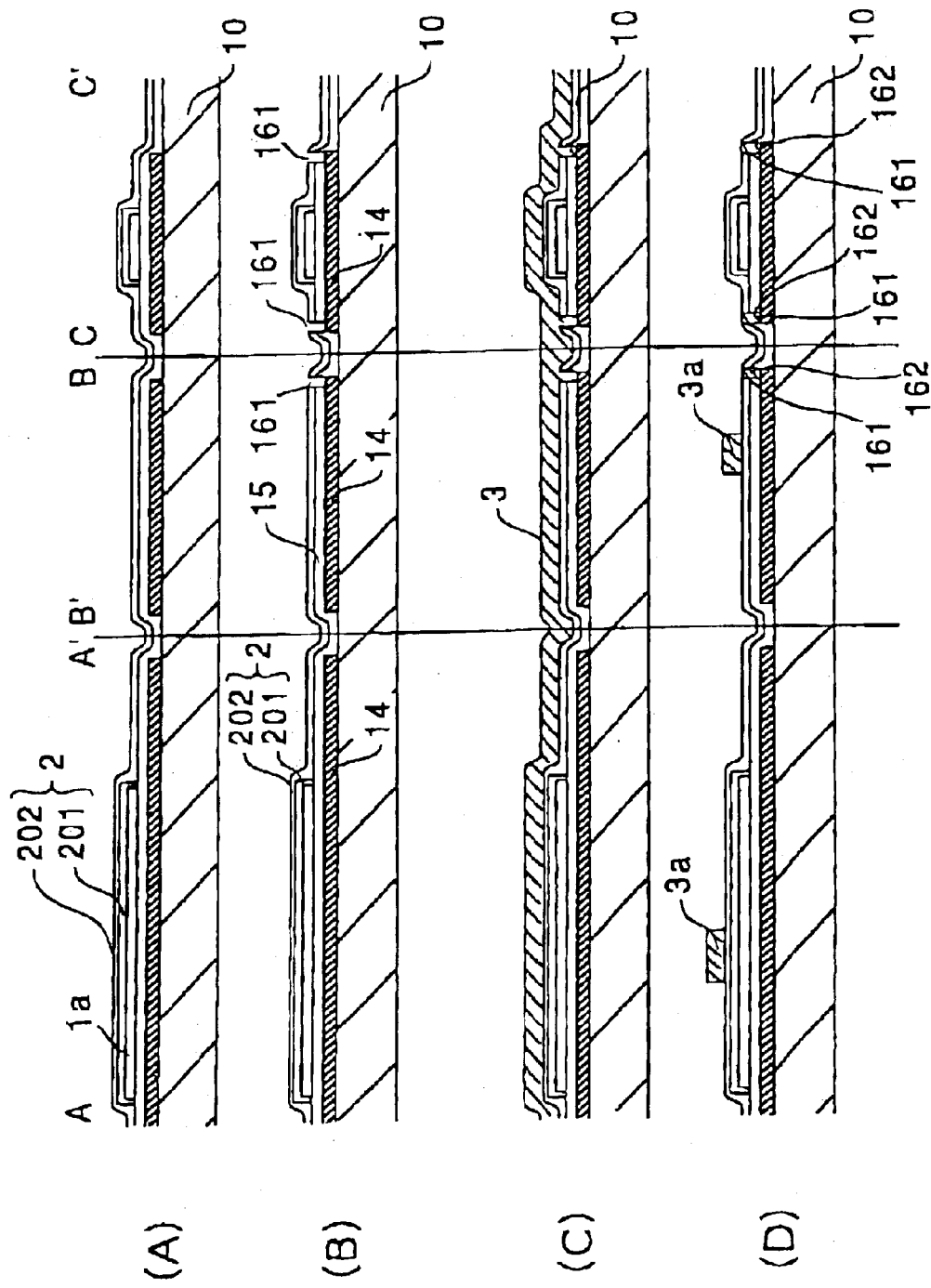
FIG. 11 is a cross-sectional view showing a process to be performed subsequent to the process shown in FIG. 10, for manufacturing the TFT array shown in FIG. 2.
Figure 12:
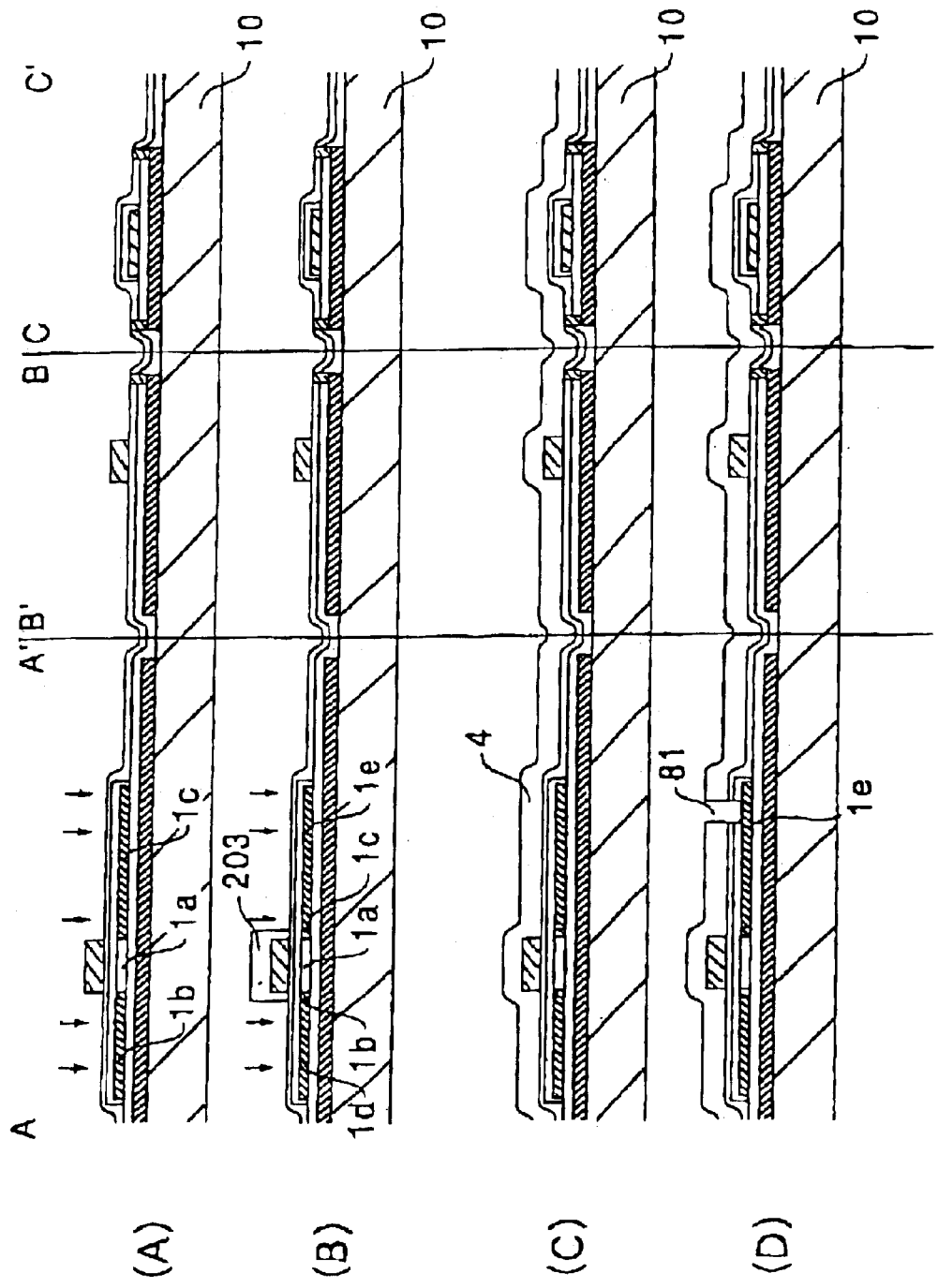
FIG. 12 is a cross-sectional view showing a process to be performed subsequent to the process shown in FIG. 11, for manufacturing the TFT array shown in FIG. 2.
Figure 13:
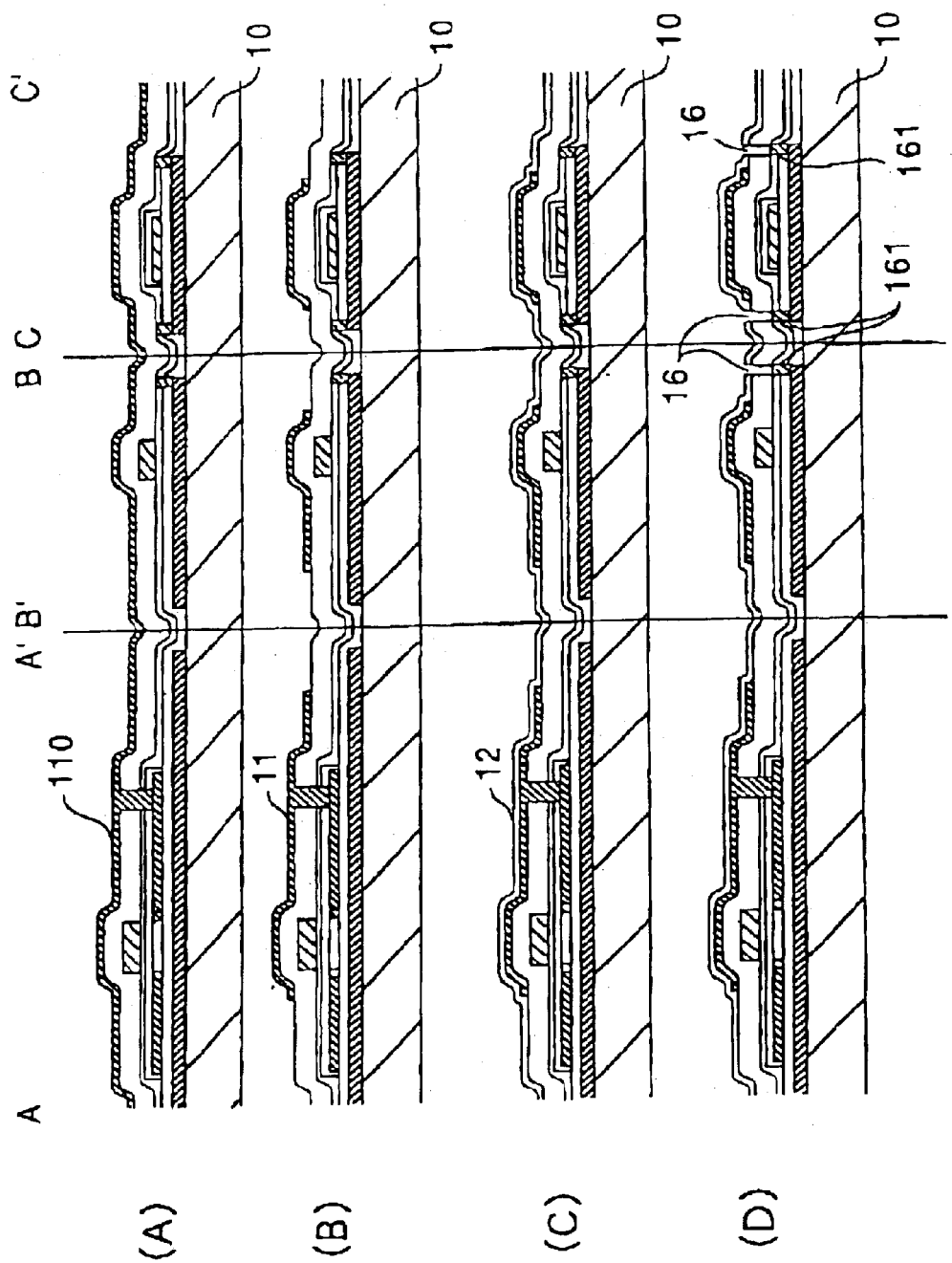
FIG. 13 is a cross-sectional view showing a process to be performed subsequent to the process shown in FIG. 12, for manufacturing the TFT array shown in FIG. 2.
Figure 14:
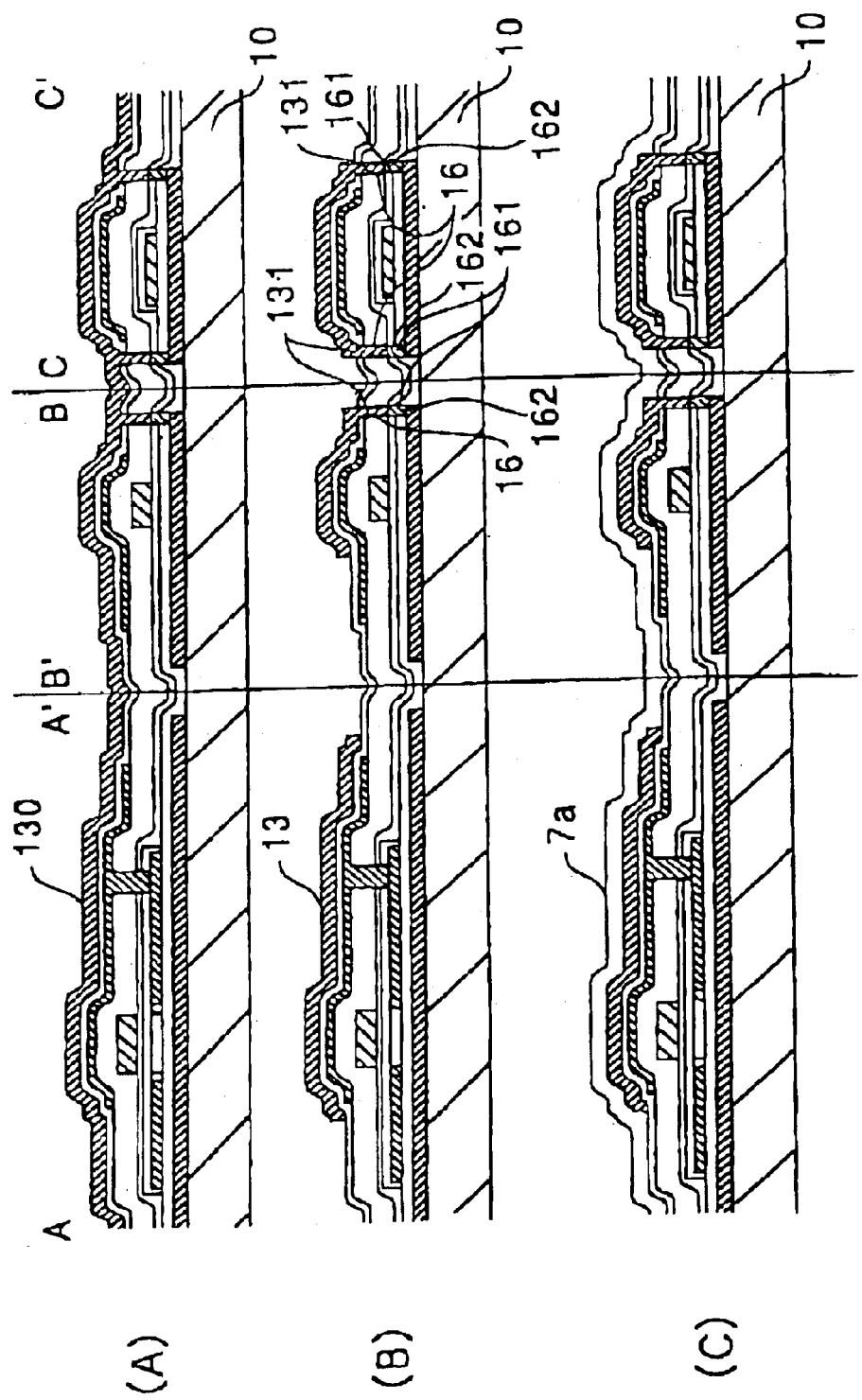
FIG. 14 is a cross-sectional view showing a process to be performed subsequent to the process shown in FIG. 13, for manufacturing the TFT array shown in FIG. 2.
Figure 15:
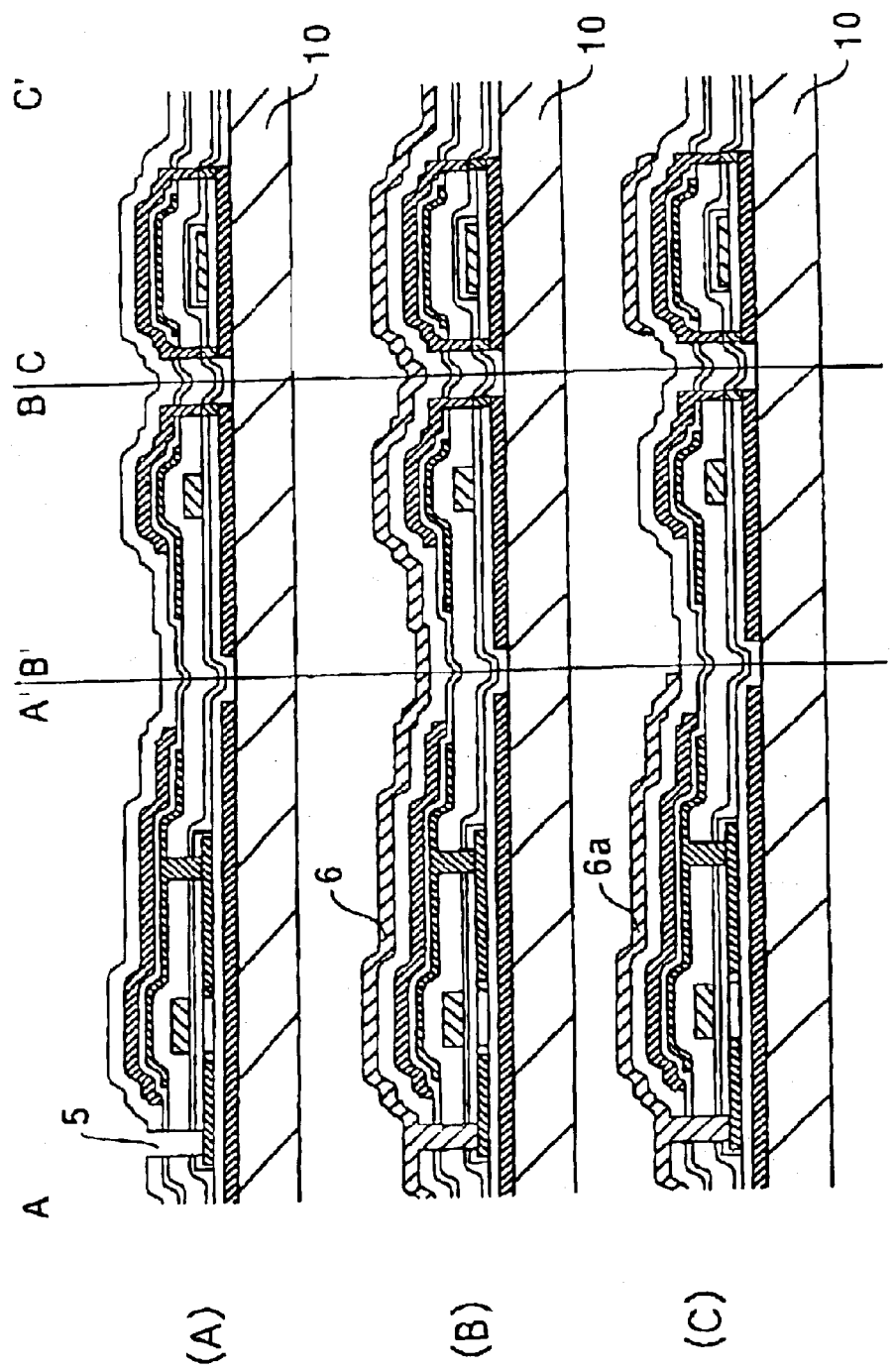
FIG. 15 is a cross-sectional view showing a process to be performed subsequent to the process shown in FIG. 14, for manufacturing the TFT array shown in FIG. 2.
Figure 16:
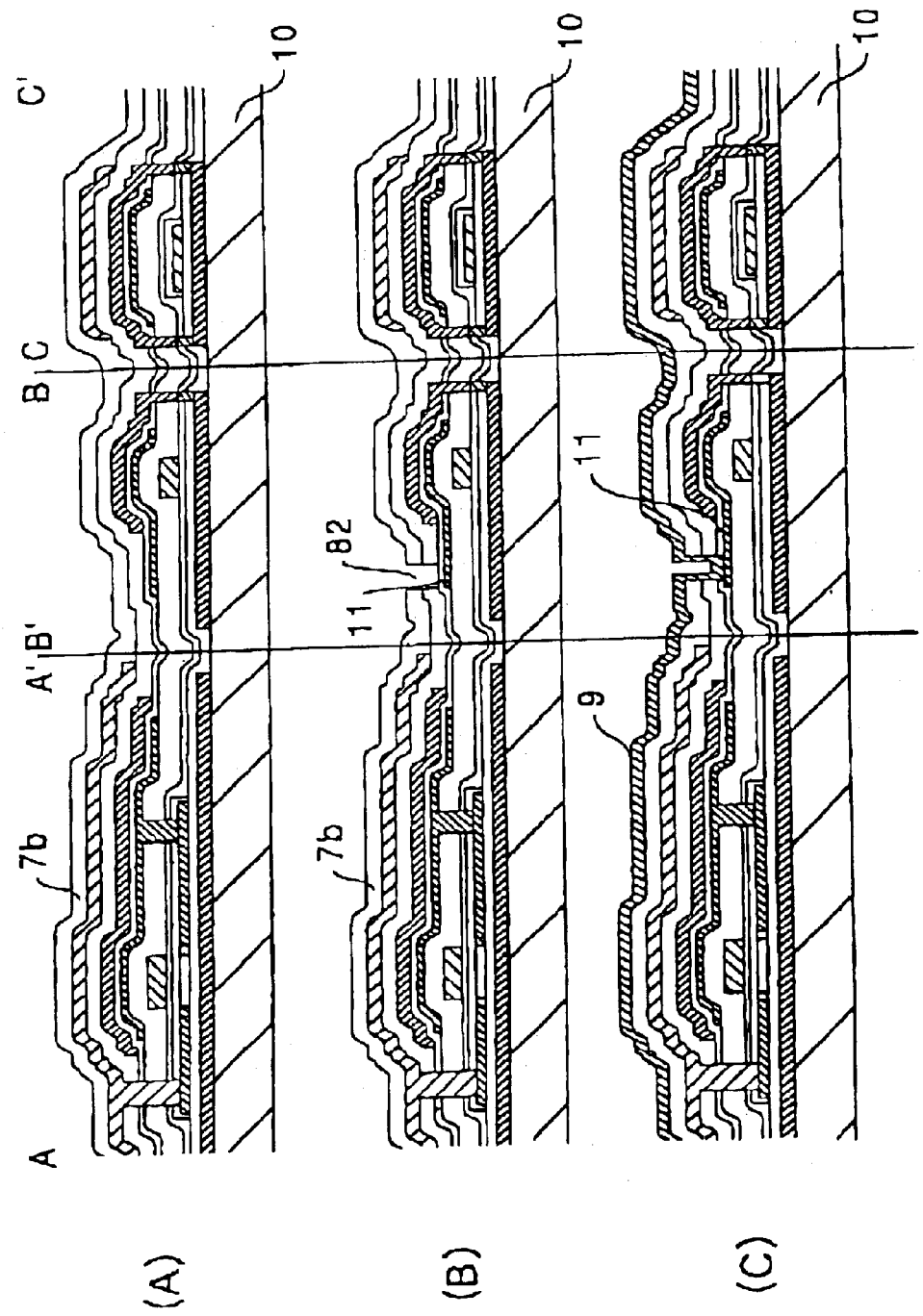
FIG. 16 is a cross-sectional view showing a process to be performed subsequent to the process shown in FIG. 15, for manufacturing the TFT array shown in FIG. 2.

In this embodiment, a side wall formation trench 16 penetrates the thin insulator 12 and the first interlayer insulator 4, laterally surrounding the channel region 1a' of the TFT 30. Referring to FIG. 8, the side wall formation trench 16 is formed along the outline of the first light shield layer 13 within the formation area of the first light shield layer 13. The formation area of the side wall formation trench 16 is represented by an area hatched with downwardly inclined lines at a pitch smaller than that of the hatch area of the first light shield layer 13.

The side wall formation trench 16 in this embodiment communicates with a connection trench 161 penetrating the gate insulator 2 and the underlayer insulator 15. The connection trench 161 is filled with a conductive layer 162 having a light shield property that is produced at the same time that the scanning line 3a (the gate electrode) is produced. The side wall formation trench 16 is filled with a light shield side wall 131 that is formed of a conductive layer having a light shield property and produced at the same time when the first light shield layer 13 is produced.

The channel region 1a' of the TFT 30 is light shielded by the scanning line 3a, the drain electrode 11, the first light shield layer 13, and the data line 6a from above, by the second light shield layer 14 from below, and by the light shield side wall 131 in the side wall formation trench 16 and the electrically conductive layer 162 in the connection trench 161 from sides.

Referring back to FIG. 6, the counter substrate 20 has a counter electrode (common electrode) 21 extending on the entire surface thereof, and an alignment layer (not shown) therebeneath which has been subjected to a predetermined alignment process such as a rubbing process. The counter electrode 21 is fabricated of a transparent conductive film such as an ITO film. The alignment layer of the counter substrate 20 is fabricated of an organic thin film such as a polyimide thin film. There are times that a light shield layer 23 is arranged in a matrix on the counter substrate 20 in an area other than the aperture area in each pixel.

For this reason, incident light L1 from the counter substrate 20 cannot enter the channel region 1a', LDD regions 1b and 1c of the semiconductor layer 1a of the TFT 30. The light shield layer 23 has the function of improving contrast and preventing color mixing of color materials.

The TFT array substrate 10 and the counter substrate 20 are arranged with the pixel electrodes 9a facing the counter electrode 21, and a liquid crystal 50 as an electrooptical material is encapsulated in a space surrounded by a sealing material, to be discussed later, between the TFT array substrate 10 and the counter substrate 20. The liquid-crystal layer 50 takes a predetermined orientation state by the alignment layers with no electric field applied by the pixel electrode 9a. The liquid-crystal layer 50 is formed of a mixture of one or several types of nematic electrooptical materials. The sealing material is an adhesive agent made of a thermal setting agent or a photo-setting agent for bonding the TFT array substrate 10 to the counter substrate 20 along the edges thereof, and is mixed with spacers such as glass fiber or glass beads to keep a predetermined distance between the two substrates.

As discussed above referring to FIG. 1 through FIG. 9, the scanning line 3a, the drain electrode 11, the first light shield layer 13, and the data line 6a are arranged over the channel region 1a' and the LDD regions 1b and 1c of the TFT 30. Strong light rays entering from the counter substrate 20 cannot reach the channel region 1a. The channel region 1a' and the LDD regions 1b and 1c of the TFT 30 are light shielded by the second light shield layer 14 from below. Even if light is reflected from the TFT array substrate 10 or light reflected from an external optical member enters the TFT array substrate 10 from the back of the TFT array substrate 10, the light is prevented from entering the channel region 1a.

Moreover, in this embodiment, even if strong light entering from the counter substrate 20 is obliquely or laterally directed to the channel region 1a, and the LDD regions 1b and 1c, no such light is admitted into the channel region 1a because the lateral portions of the channel region 1a' and the LDD regions 1b and 1c are light shielded by the light shield side wall 131 in the side wall formation trench 16 and the conductive layer 162 in the connection trench 161.

Accordingly, even if a strong light ray enters from the counter substrate 20, as in a projection-type display apparatus to be discussed later, the electrooptical device 100 of this embodiment is free from erratic operations of the TFT 30 and a drop in reliability of the TFT 30, attributed to the admittance of light into the channel region 1a' of the TFT 30.

In this embodiment, the drain electrode 11 electrically connected to the pixel electrode 9a in each pixel and the first light shield layer 13 common to all pixels are opposed to each other with the thin insulator 12 interposed therebetween in a wide area. The first light shield layer 13 and the second light shield layer 14 are electrically connected to each other through the light shield side wall 131 in the side wall formation trench 16 and the conductive layer 162 in the connection trench 161. If the second light shield layer 14 is fixed to a potential, the first light shield layer 13 is fixed to the same potential. In this embodiment, the storage capacitor 70 is formed by having the drain electrode 11, the first light shield layer 13 as the capacitive electrodes thereof, and the thin insulator 12 as a conductive layer. Since this arrangement eliminates the need for routing a dedicated capacitive line to each pixel, the pixel aperture ration is increased.

The method of manufacturing the electrooptical device 100 of the first embodiment having the above construction is now discussed, referring to FIG. 10 through FIG. 16.

The method of manufacturing the TFT array substrate 10 is now discussed. Referring to FIG. 10 through FIG. 16, there shown are cross-sectional views showing processes of manufacturing the TFT array substrate 10 of this embodiment. FIG. 10 through FIG. 16 show cross sections of the TFT array substrate 10 corresponding to those taken along line A–A', B–B', and C–C' in FIG. 2.

Referring to FIG. 10(A), a TFT array substrate 10 fabricated of a glass substrate or a quartz substrate, for instance, is prepared. The TFT array substrate 10 is preferably annealed in an inert gas atmosphere, such as $N_2$ (nitrogen) gas, within a temperature range of 900 to 1300 degrees Centigrade so that the TFT array substrate 10 suffers from less distortion in a subsequent high temperature thermal process. In other words, the TFT array substrate 10 is subjected beforehand to a heat treatment as high as or higher than the maximum temperature expected in the high temperature thermal process in the manufacturing process.

A tungsten silicide layer 140 as the second light shield layer 14 is formed to be 200 nm thick. The tungsten silicide layer 140 is then patterned as shown in FIG. 10(B), thereby forming the second light shield layer 14.

Formed on the TFT array substrate 10 is the underlayer insulator 15 fabricated of a silicate glass film, such as NSG (non-silicate glass), PSG (phosphosilicate glass), BSG (borosilicate glass), or BPSG (borophosphosilicate glass), a silicon nitride film, or a silicon oxide film, using a TEOS (tetraethylorthosilicate) gas, a TEB (triethyl borate) gas, or a TMOP (trimethyl phosphate) gas by an atmospheric CVD method or a reduced pressure CVD method. The thickness of the underlayer insulator 15 is within a range from 500 to 2000 nm.

Referring to FIG. 10(C), an amorphous silicon layer 1a" is deposited on the underlayer insulator 15 using a reduced pressure CVD (at a pressure of 20 to 40 Pa) with monosilane gas or disilane gas at a flow rate within a range from 400 cc/minute to 600 cc/minute in a relatively low temperature environment within a range from 450 degrees C. to 550 degrees C., preferably at about 500 degree C. The TFT array substrate 10 is subjected to an annealing process at a temperature within a range from 600 degrees C. to 700 degrees C. for the duration from one hour to ten hours, preferably for the duration from four to six hours in a nitrogen atmosphere, and a polysilicon layer 1 is grown by solid-phase epitaxy to a thickness within a range from 50 nm to 200 nm, preferably to a thickness of approximately 100 nm.

When the pixel switching TFT 30 is of a P-channel type, the channel formation region may be doped with a small amount of Group V dopant, such as Sb (antimony), As (arsenic), or P (phosphorus), through an ion implantation technique. When the pixel switching TFT 30 is of an N-channel type, the channel formation region may be doped with a small amount of Group III dopant, such as B (boron), Ga (gallium), or In (indium), through an ion implantation technique. The polysilicon 1 may be directly formed through the reduced pressure CVD rather than by way of the amorphous silicon layer. The polysilicon layer deposited through the reduced pressure CVD is implanted with silicon ions to form an amorphous silicon layer, and the amorphous silicon layer is then recrystallized through an anneal process to form the polysilicon layer 1.

Referring to FIG. 10(D), the semiconductor layer 1a having the pattern shown in FIG. 2 and FIG. 5 is formed through a photolithographic step and an etching step.

Referring to FIG. 11(A), the semiconductor layer 1a forming the TFT 30 is thermally oxidized at a temperature within a range from 900 degrees Centigrade to 1300 degrees Centigrade, preferably at a temperature of approximately 1000 degrees Centigrade. A relatively thin thermally-oxidized silicon layer 201 as thin as 30 nm is then formed. A high temperature oxide layer 202 (HTO layer) or a silicon nitride layer is deposited to a thickness of about 50 nm using the reduced pressure CVD. A gate insulator 2 having a multi-layer structure thus can be achieved. A gate insulator 2 having a single layer structure may be deposited only through the thermal oxidation. After the formation of the gate insulator 2, the above-referenced ion implantation may be performed.

Referring to FIG. 11(B), the connection trench 161 reaching the second light shield layer 14 is formed in the gate insulator 2 and the underlayer insulator 15.

Referring to FIG. 11(C), a polysilicon layer 3 is deposited through the reduced pressure CVD, and is thermally diffused with phosphorus (P) to make the polysilicon layer 3 conductive. A doped silicon layer may be used which is doped with P ions at the film formation phase of the polysilicon layer 3.

Referring to FIG. 11(D), the scanning line 3a (the gate electrode) having the pattern shown in FIG. 2 and FIG. 4 is formed through a photolithographic step or an etching step using a resist mask. The thickness of the scanning line 3a is about 350 nm. The connection trench 161 is filled with a conductive layer 162 which is made from the same material as the scanning line 3a.

When the TFT 30 shown in FIG. 6 is of an n-channel TFT having a LDD structure, the semiconductor layer 1a is lightly doped with a Group V dopant 200 such as P with the scanning line 3a (the gate electrode) as a diffusion mask (with a dose of P ions falling within a range from $1 \times 10^{13}/cm^2$ to $3 \times 10^{13}/cm^2$) in order to form the lightly doped source region 1b and the lightly doped drain region 1c in the semiconductor layer 1a as shown in FIG. 12(A). The semiconductor 1a beneath the scanning line 3a (the gate electrode) becomes the channel region 1a'. With this impurity doping, the resistance of the scanning line 3a is reduced.

After a resist mask 203 wider than the scanning line 3a (the gate electrode) is deposited on the scanning line 3a (the gate electrode), the semiconductor layer 1a is heavily doped with a Group V dopant 201 such as P (for example, with a dose of P ions falling within a range from $1 \times 10^{15}/cm^2$ to $3 \times 10^{15}/cm^2$) in order to form the heavily doped source region 1d and the heavily doped drain region 1e of the TFT 30 as shown in FIG. 12(B). The n-channel TFT may have an offset structure without implanting a light dose of impurity.

When the TFT 30 is of a p-channel, the semiconductor layer 1a is doped with a Group III dopant such as B in order to form the lightly doped source region 1b, the lightly doped drain region 1c, the heavily doped source region 1d, and the heavily doped drain region 1e in the semiconductor layer 1a. The TFT may have an offset structure without implanting a light dose of impurity. A self-alignment TFT may be produced using an ion implantation technique for P ions or B ions with the scanning line 3a (the gate electrode) as a mask. With this low-dose impurity doping, the resistance of the scanning line 3a is further reduced.

In parallel with these steps, peripheral circuits such as a data line driving circuit and a scanning line driving circuit, respectively having a complementary structure of a n-channel TFT and a p-channel TFT, are produced on the periphery of the TFT array substrate 10. Since the pixel switching TFT 30 is a polysilicon TFT in this embodiment, the peripheral circuits such as the data line driving circuit and the scanning line driving circuit are produced at substantially the same steps as those for the pixel switching TFTs. This feature is advantageous from the manufacturing process standpoint.

Referring to FIG. 12(C), the interlayer insulator 4 covering the scanning line 3a (the gate electrode) of the TFT 30 is formed of a silicate glass film such as NSG, PSG, BSG, or BPSG, a silicon nitride film, or a silicon oxide film, using a TEOS gas by an atmospheric CVD method or a reduced pressure CVD method. The thickness of the interlayer insulator 4 is preferably within a range from 500 to 1500 nm.

Referring to FIG. 12(D), the contact hole 81 for connecting the heavily doped drain region 1e to the drain electrode 11 is formed using a dry etching process such as a reactive ion etching or a reactive ion beam etching, or a wet etching process.

Referring to FIG. 13(A), a polysilicon layer 110 is deposited to produce the drain electrode 11 on the surface of the first interlayer insulator 4 by the reduced CVD method. The polysilicon layer 110 is thermally diffused with phosphorus (P) to be conductive. Alternatively, a doped silicon layer may be used which is doped with P ions at the film formation phase of the polysilicon layer 110.

Figure 7:
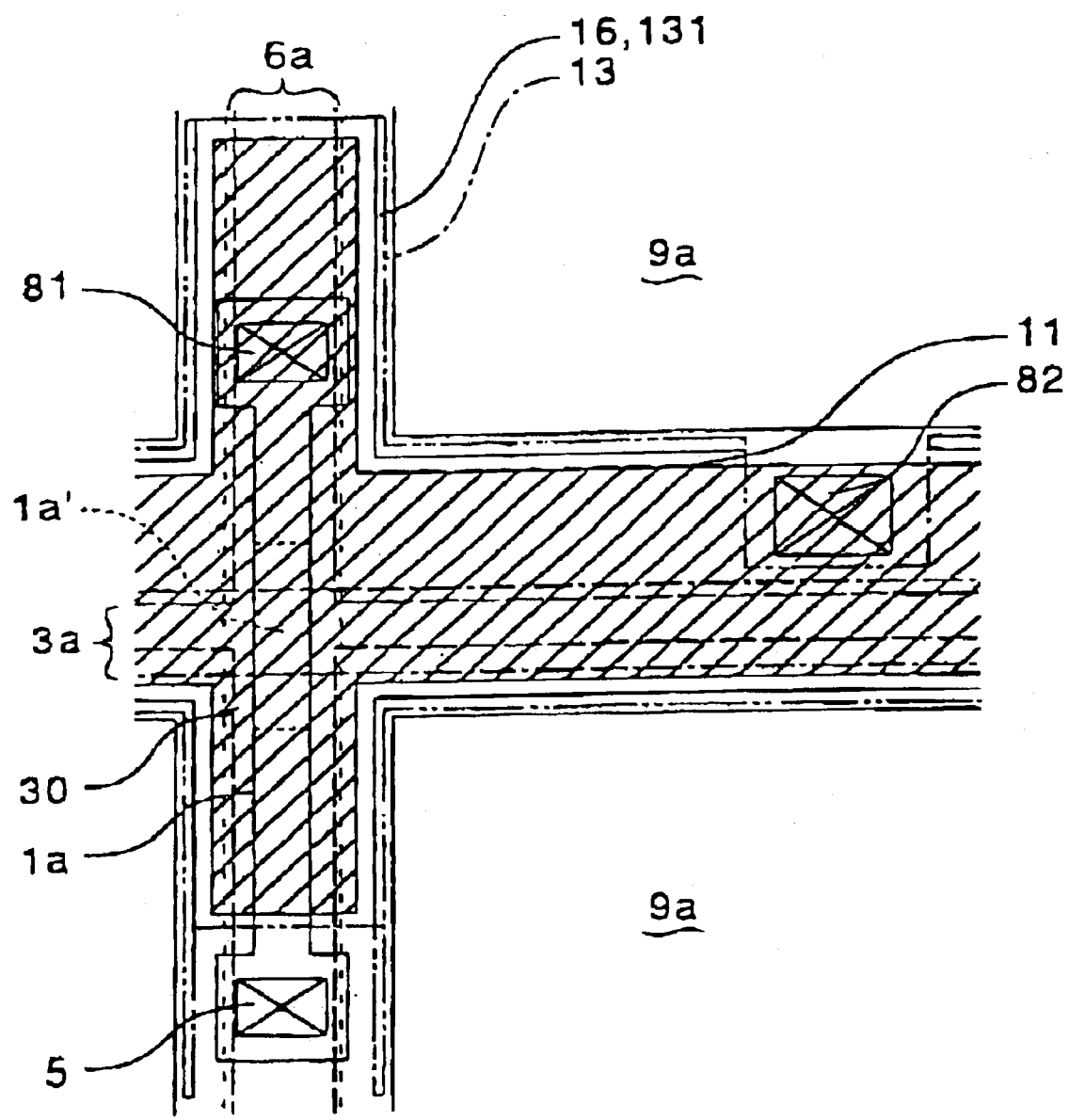
FIG. 7 is an enlarged view showing the formation area of a drain electrode in the TFT array substrate of FIG. 2.

Referring to FIG. 13(B), the drain electrode 11 having the pattern shown in FIG. 2 and FIG. 7 is produced through a photolithographic step and an etching step using a resist mask.

Referring to FIG. 13(C), a thin insulator 12 is deposited on the surface of the drain electrode 11.

Referring to FIG. 13(D), the side wall formation trench 16 for forming the light shield side wall 131 using the first light shield layer 13 is formed in the thin insulator 12 and the first interlayer insulator 4 by using a dry etching process, such as a reactive ion etching or a reactive ion beam etching, in a way that the side wall formation trench 16 communicates with the connection trench 161. The side wall formation trench 16 is then integrally formed with the connection trench 161.

Referring to FIG. 14(A), a tungsten silicide layer 130 for forming the first light shield layer 13 on the surface of the insulator 12 is deposited to a thickness of about 200 nm. The tungsten silicide layer 130 is patterned as shown in FIG. 14(B), thereby forming the first light shield layer 13. The light shield side wall 131 is formed in the side wall formation trench 16 at the same time that the first light shield layer 13 is produced, and is electrically connected to the layer 162 on the bottom portion of the side wall formation trench 16.

Referring to FIG. 14(C), the second interlayer insulator 7a is formed, comprising a silicate glass film, such as NSG, PSG, BSG, or BPSG, a silicon nitride film, or a silicon oxide film, using a TEOS gas by an atmospheric CVD method or a reduced pressure CVD method. The thickness of the second interlayer insulator 7a is preferably within a range from 500 to 1500 nm.

Referring to FIG. 15(A), the contact hole 5 for the data line 3a (the source electrode) is formed using a dry etching process such as a reactive ion etching or a reactive ion beam etching, or a wet etching process.

Referring to FIG. 15(B), a metal layer 6 of a low-resistance metal such as Al, or a metal silicide, is deposited on the second interlayer insulator 7a to a thickness falling within a range from 100 nm to 500 nm, preferably, to a thickness of approximately 300 nm using a sputtering technique.

Referring to FIG. 15(C), the data line 6a (the source electrode) is produced using a photolithographic step and an etching step.

Referring to FIG. 16(A), the third insulator 7b covering the data line 6a (the source electrode) is formed, including a silicate glass film such as NSG, PSG, BSG, or BPSG, a silicon nitride film, or a silicon oxide film, using a TEOS gas by an atmospheric CVD method or a reduced pressure CVD method. The thickness of the third insulator 7b is preferably within a range from 500 to 1500 nm.

Referring to FIG. 16(B), the contact hole 82 for electrically connecting the pixel electrode 9a to the drain electrode 11 is produced by using a dry etching process such as a reactive etching or a reactive ion beam etching.

Referring to FIG. 16(C), a conductive transparent layer 9 such as an ITO film is deposited on the third insulator 7b to a thickness falling within a range from 50 nm to 200 nm by using a sputtering technique.

The conductive transparent layer 9 is patterned through a photolithographic step, and an etching step, thereby forming the pixel electrode 9a as shown in FIG. 6. Polyimide-based alignment liquid is applied on the pixel electrode 9a to form an alignment layer. A rubbing process is then performed on the alignment layer to impart a predetermined pretilt angle to the alignment layer.

The production of the TFT array substrate 10 of the electrooptical device 100 is now complete.

To produce the counter substrate 20 shown in FIG. 6, a glass substrate is first prepared. A light shield layer 23 on the counter substrate and a light shield layer 53 (see FIG. 24 and FIG. 25) as a frame for partitioning a display area from a non-display area are produced by sputtering chromium and then through a photolithographic step, and an etching step. The counter substrate light shield layer 23 and the light shield layer 53 as a frame are fabricated of a metal such as Cr, Ni, Al, or dispersed resin black in which carbon or Ti is mixed with photoresist.

A conductive transparent layer such as an ITO layer is deposited on the entire surface of the counter substrate 20 to a thickness of 50 nm to 200 nm through a sputtering technique. The counter electrode 21 is thus formed. Polyimide-based alignment liquid is applied on the pixel electrode 9a to form an alignment layer. A rubbing process is then performed on the alignment layer to impart a predetermined pretilt angle to the alignment layer. The formation of the alignment layer is thus completed.

The production of the counter substrate 20 of the electrooptical device 100 is complete.

In this way, the TFT array substrate 10 and the counter substrate 20 are bonded together with the alignment layers facing each other using a sealing member (not shown). Through vacuum absorption, an electrooptical material including a mixture of a plurality of nematic electrooptical materials is drawn into the space between the two substrates. The liquid crystal layer 50 having a predetermined thickness is thus obtained. The production of the electrooptical device 100 of the first embodiment already discussed with reference to FIG. 1 through FIG. 9 is thus completed.

Figure 17:
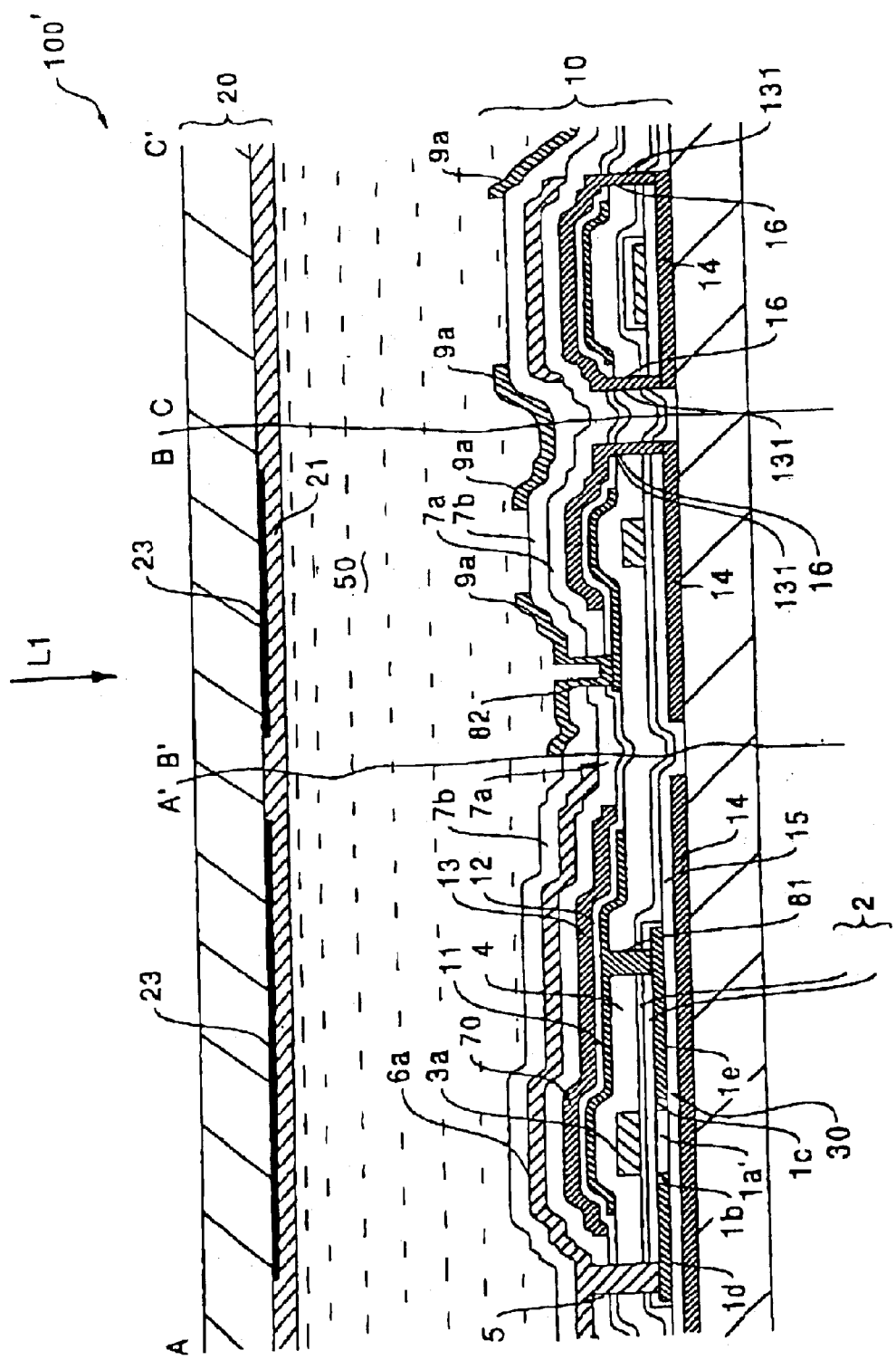
FIG. 17 is a cross-sectional view of the electrooptical device of a second embodiment of the present invention.

The electrooptical device of a second embodiment of the present invention is now discussed, referring to FIG. 17. FIG. 17 is a cross-sectional view of an electrooptical device 100' of the second embodiment of the present invention.

The manufacturing method of the electrooptical device 100' of the second embodiment is different from the that of the electrooptical device 100 of the first embodiment in that the process for forming the connection trench 161, as in the description of the first embodiment with reference to FIG. 11(B), is eliminated and in that the side wall formation trench 16 is formed to reach the second light shield layer 14 as shown in FIG. 17 in the second embodiment in the formation step of the side wall formation trench 16 described in the first embodiment with reference to FIG. 13(D). The rest of the manufacturing process remains unchanged from that of the first embodiment.

With the electrooptical device 100' manufactured as shown in FIG. 17, the light shield side wall 131 fabricated of the same material as that of the first light shield layer 13 fills the side wall formation trench 16 when the first light shield layer 13 is formed. The light shield side wall 131 is directly in contact with the second light shield layer 14 on the bottom of the side wall formation trench 16. The electrooptical device 100' of the second embodiment has a TFT array substrate 10 different from that included in the electrooptical device 100' of the first embodiment shown in FIG. 6, and the rest of the construction is the same as that of the electrooptical device 100' of the first embodiment as described with reference to FIG. 6. Therefore, the corresponding elements are designated with the same reference numerals, and the discussion thereof is omitted.

Figure 18:
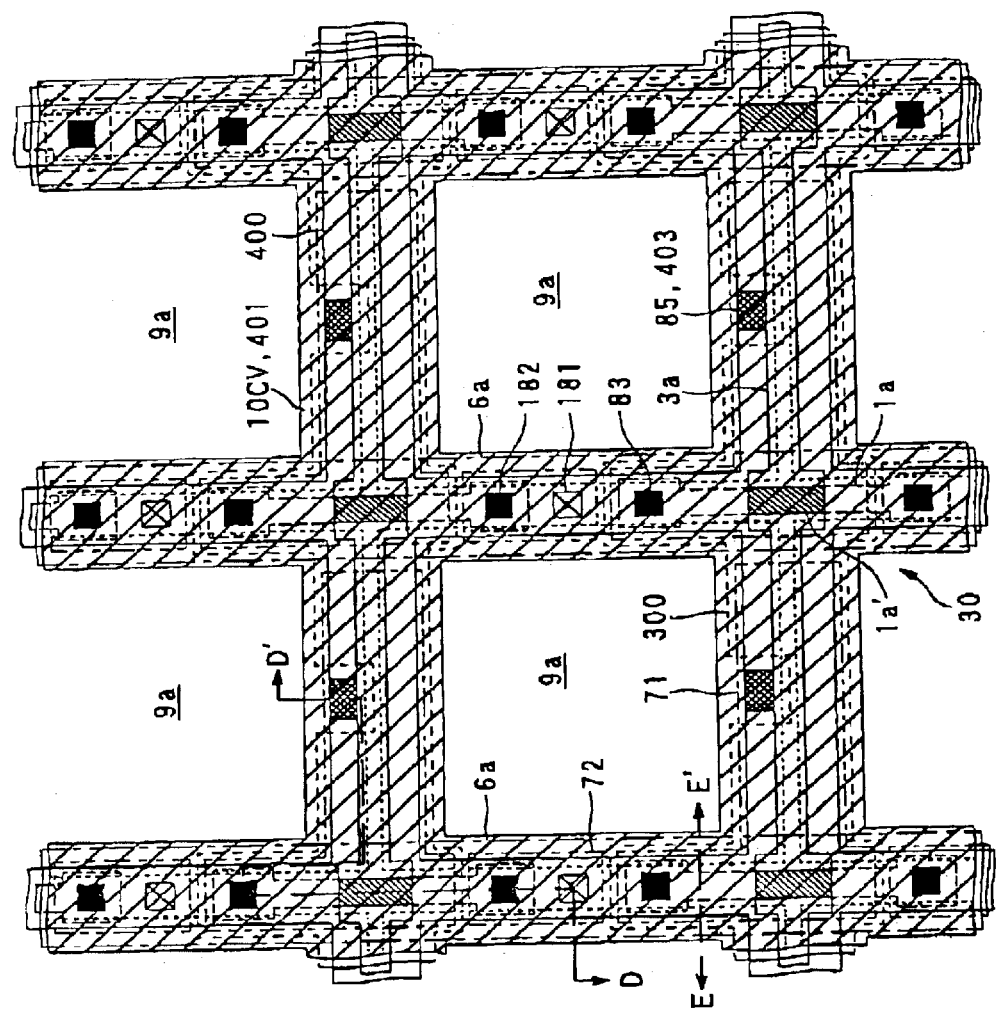
FIG. 18 is a plan view showing a plurality of pixel groups adjacent to each other in a TFT array substrate having a data line, a scanning line, and a pixel electrode, thereon in an electrooptical device of a third embodiment.
Figure 19:
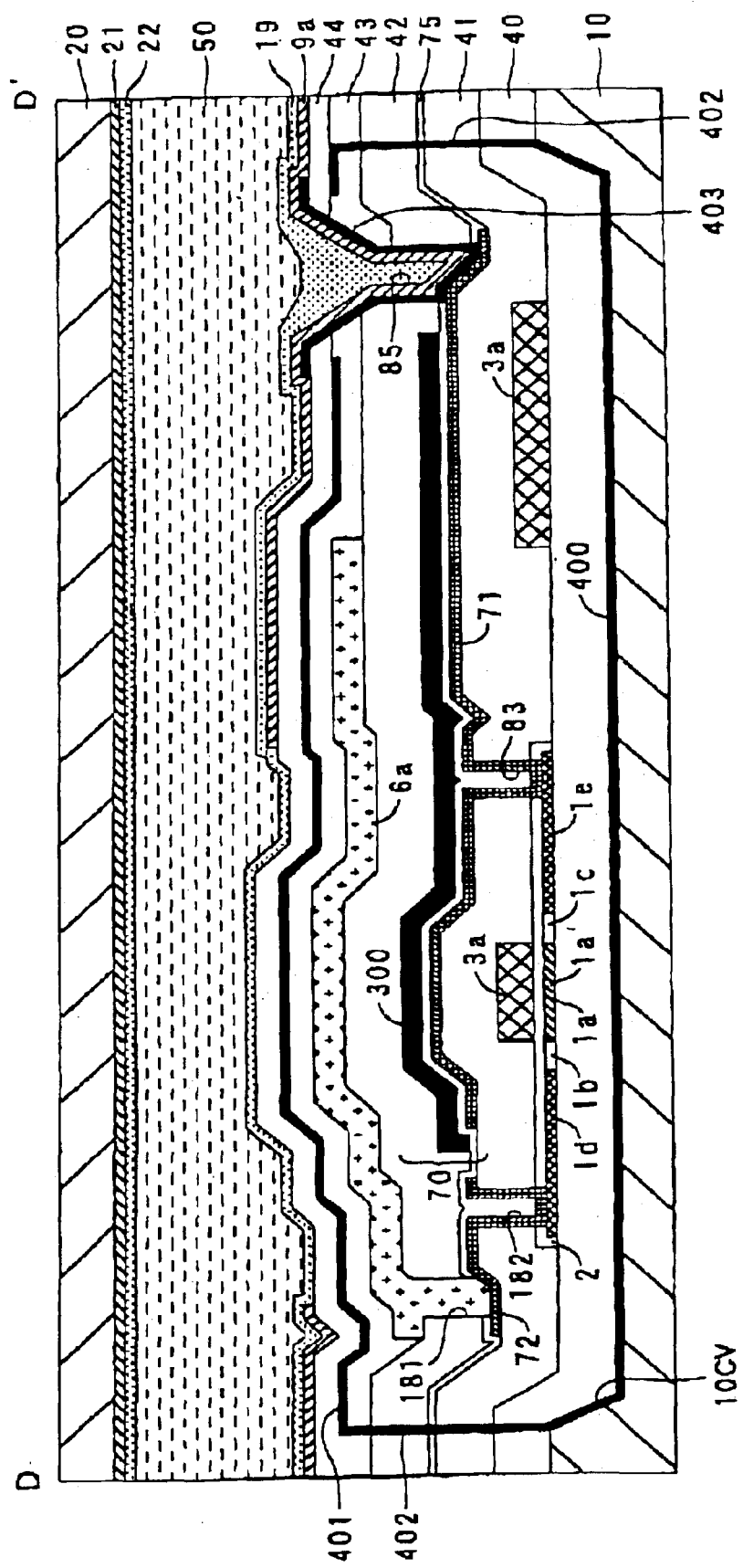
FIG. 19 is a cross-sectional view of the TFT array substrate taken along line D–D' in FIG. 18.
Figure 20:
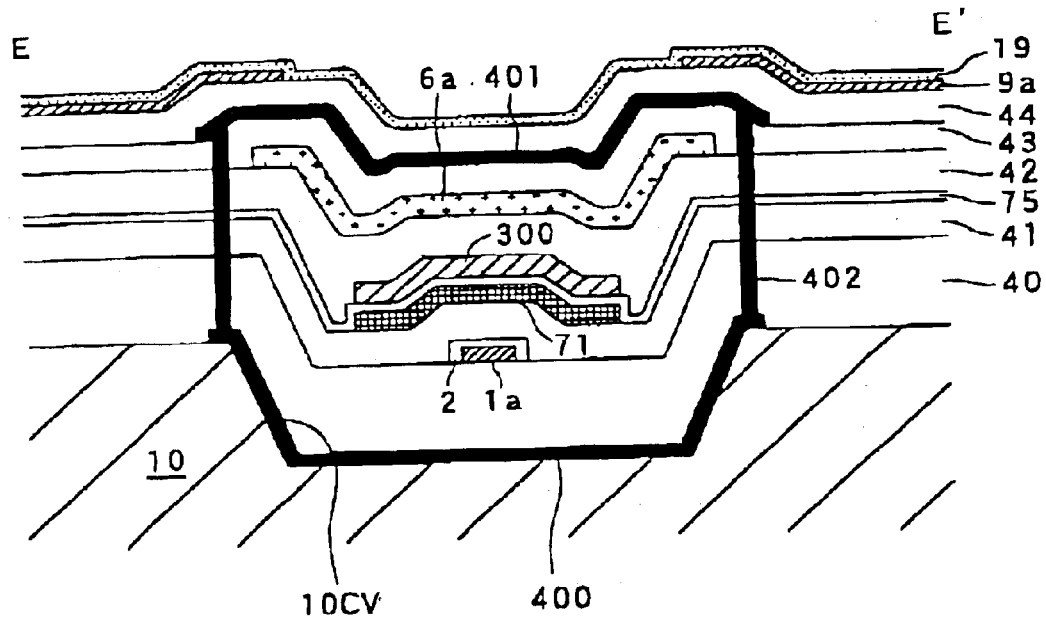
FIG. 20 is a cross-sectional view of the TFT array substrate taken along line E–E' in FIG. 18.

The construction of the pixel of the electrooptical device in a third embodiment of the present invention is now discussed, referring to FIG. 1 and FIG. 18 through FIG. 20. FIG. 18 is a plan view showing a plurality of pixel groups adjacent to each other in a TFT array substrate having a data line, a scanning line, and a pixel electrode, formed thereon in an electrooptical device of the third embodiment. FIG. 19 is a cross-sectional view of the TFT array substrate taken along line D–D' in FIG. 18. FIG. 20 is a cross-sectional view of a part of laminate structure formed on the TFT array substrate taken along line E–E' in FIG. 18. Referring to FIG. 19 and FIG. 20, layers and members are not necessarily drawn to equal scale to show the layers and members in easy-to-recognize sizes. In FIG. 18 through FIG. 20 showing the third embodiment, the components identical to those described with reference to FIG. 1 through FIG. 9 showing the first embodiment are designated with the same reference numerals, and the discussion thereof is omitted as appropriate.

The basic construction of the circuit arrangement of the electrooptical device of the third embodiment remains substantially similar to that of the electrooptical device of the first embodiment shown in FIG. 1. In the first embodiment, the second light shield layer 14 has the function of the capacitive line for fixing the fixed-potential capacitive electrode of the storage capacitor 70 to a fixed potential. In the third embodiment, a capacitive line overlaps and runs over the scanning line 3a.

Referring to FIG. 18 and FIG. 19, a capacitive line 300 including the fixed-potential capacitive electrode is arranged. Specifically, in a plan view, the capacitive line 300 extends in a stripe configuration along the scanning line 3a and juts upward and downward in a region overlapping the TFT 30 as shown in FIG. 18. The formation area of the storage capacitor 70 is increased making use of the area over the scanning line 3a and the area beneath the data line 6a.

Referring to FIG. 18 through FIG. 20, the storage capacitor 70 in the third embodiment is formed of an intermediary layer 71, as a pixel-potential capacitive electrode, connected to the heavily doped drain region 1e of the TFT 30 and to the pixel electrode 9a, and of a portion of the capacitive line 300 as a fixed-potential capacitive electrode, arranged opposed to each other, with a dielectric layer 75 interposed between the intermediary layer 71 and the portion of the capacitive line 300.

The capacitive line 300, fabricated of a metal layer containing a metal or an alloy, functions as the fixed-potential capacitive electrode. The capacitive line 300 is formed of a single metal layer, an alloy layer, a metal silicide layer, a polysilicide layer, or a multilayer of these layers, each of which layers comprises at least a refractory metal, such as Ti, Cr, W, Ta, Mo, and Pb. The capacitive line 300 may have a multi-layer structure formed of a first layer fabricated of a conductive polysilicon layer, and a second layer fabricated of a metal silicide layer containing a refractory metal.

The intermediary layer 71, fabricated of a conductive polysilicon layer, functions as a pixel-potential capacitive electrode. Besides the function of the pixel-potential capacitive electrode, the intermediary layer 71 has the function of electrically connecting the pixel electrode 9a to the heavily doped drain region 1e of the TFT 30. The intermediary layer 71 may also have a single layer structure containing a metal or an alloy or a multi-layer structure like the capacitive line 300.

Referring to FIG. 18 and FIG. 20, a trench 10CV is formed in the TFT array substrate 10 in a grid area coarsely hatched with downwardly inclined lines in FIG. 18. A lower light shield layer 400 is arranged in a grid configuration within the trench 10CV. Like the capacitive line 300, the lower light shield layer 400 is formed of a single metal layer, an alloy layer, a metal silicide layer, a polysilicide layer, or a multilayer of these layer, each of which layers comprises at least a refractory metal, such as Ti, Cr, W, Ta, Mo, and Pb.

In the grid area coarsely hatched with downwardly inclined lines shown in FIG. 18, an upper light shield layer 401 is arranged. Like the lower light shield layer 400, the upper light shield layer 401 is formed of a single metal layer, an alloy layer, a metal silicide layer, a polysilicide layer, or a multilayer of these layer, each of which layers comprises at least a refractory metal, such as Ti, Cr, W, Ta, Mo, and Pb. Further, a narrow groove is formed along the outline of the upper light shield layer 401, penetrating a fourth interlayer insulator 44, a third interlayer insulator 43, a dielectric layer 75, a second interlayer insulator 42, a first interlayer insulator 41, and an underlayer insulator 40. A side wall light shield layer 402, filling the narrow groove, extends from the upper light shield layer 401 to the lower light shield layer 400. The side wall light shield layer 402 is formed of a single metal layer, an alloy layer, a metal silicide layer, a polysilicide layer, or a multilayer of these layer, each of which layers comprises at least a refractory metal, such as Ti, Cr, W, Ta, Mo, and Pb. The lower light shield layer 400, the upper light shield layer 401 and the side wall light shield layer 402 may be formed of the same light shield layer or different light shield layers.

Referring to FIG. 19 and FIG. 20, elements and lines formed in the image display area of the TFT array substrate 10, such as the TFT 30, the scanning line 3a, the data line 6a, the capacitive line 300, and the storage capacitor 70, are three-dimensionally light shielded by the lower light shield layer 400, the upper light shield layer 401, and the side wall light shield layer 402 in the third embodiment. Referring to FIG. 19, a conductive, light shield layer 403 is arranged in a contact hole 85 connecting the pixel electrode 9a to the intermediary layer 71 so that no light enters a space defined by the lower light shield layer 400, the upper light shield layer 401 and the side wall light shield layer 402 through the vicinity of the contact hole 85.

Referring to FIG. 19 and FIG. 20, the dielectric layer 75, interposed between the intermediary layer 71 as the capacitive electrode and the capacitive line 300, may be formed of a silicon oxide layer, such as an HTO (High Temperature Oxide) layer or an LTO (Low Temperature Oxide) layer, or a silicon nitride layer, each of which layers has a relatively thin thickness falling within a range from 5 to 200 nm. To increase the capacitance of the storage capacitor 70, the thinner the dielectric layer 75 is, the better it is as long as layer reliability is assured.

The capacitive line 300 extends from the image display area, where the pixel electrode 9a is arranged, to the periphery of the pixel electrode 9a. The capacitive line 300 is electrically connected to a constant voltage power source to be fixed to a constant potential. The constant voltage power source may be a positive voltage power source or a negative voltage power source for supplying power to a scanning line driving circuit, to be discussed later, which supplies the scanning line 3a with a scanning signal for driving the TFT 30, and a data line driving circuit, to be discussed later, for controlling a sampling circuit which supplies the data line 6a with an image signal. The constant voltage power source may be fixed to a constant voltage supplied to the counter electrode 21 of the counter substrate 20.

Like the capacitive line 300, the lower light shield layer 400, the upper light shield layer 401, and the side wall light shield layer 402 may extend from the image display area to its periphery and may be connected to a constant voltage power source to control an adverse effect on the TFT 30 arising from variations in the potential of the lower light shield layer 400, the upper light shield layer 401, and the side wall light shield layer 402.

The pixel electrode 9a is electrically connected to the heavily doped drain region 1e of the semiconductor layer 1a via the intermediary layer 71, and the contact holes 83 and 85. In this embodiment, in addition to the function of the pixel-potential capacitive electrode of the storage capacitor 70, the intermediary layer 71 has the function of connecting the pixel electrode 9a to the TFT 30. Even if an interlayer distance is as long as 2000 nm or so, two relatively small diameter contact holes connected in series connect the pixel electrode 9a to the TFT 30 in an excellent condition using the intermediary layer 71, preventing any technical difficulty such as of connecting the pixel electrode 9a to the TFT 30 using a single contact hole. The aperture ratio of the pixel is thus increased. Etching through is prevented during the opening of the contact hole.

Similarly, the data line 6a is connected to the heavily doped source region 1d of the semiconductor layer 1a via a intermediary layer 72, formed of the same conductive layer as that of the intermediary layer 71, and the contact holes 181 and 182.

Referring to FIG. 19, the TFT array substrate 10 is provided with the pixel electrodes 9a, and arranged on top of them is an alignment layer 19 which has been subjected to a predetermined rubbing process. The pixel electrode 9a is fabricated of a transparent conductive film, such as an ITO (Indium Tin Oxide) film. The alignment layer 19 is fabricated of an organic thin film, such as a polyimide film.

The counter substrate 20 has a counter electrode 21 extending on the entire surface thereof, and an alignment layer 22 therebeneath that has been subjected to a predetermined rubbing process. The counter electrode 21 is fabricated of a transparent conductive film, such as an ITO film. The alignment layer 22 is fabricated of an organic film, such as a polyimide film.

An underlayer insulator 40 is arranged beneath the pixel switching TFT 30. The underlayer insulator 40 is formed on the entire surface of the TFT array substrate 10. Besides the function of assuring interlayer insulation between the lower light shield layer 400 and the TFT 30, the underlayer insulator 40 has the function of preventing the characteristics of the pixel switching TFT 30 from being degraded by surface irregularity of the TFT array substrate 10 caused during a polishing process or dirt left after a cleaning operation.

Arranged on the scanning line 3a is the first interlayer insulator 41 through which a contact hole 182 leading to the heavily doped source region 1d and a contact hole 83 leading to the heavily doped drain region 1e are opened.

The intermediary layer 71, the intermediary layer 72, and the capacitive line 300 are formed on the first interlayer insulator 41. Arranged on these layers are the second interlayer insulator 42 through which a contact hole 181 and the contact bole 85, respectively leading to the intermediary layer 72 and the intermediary layer 71, are opened.

The data line 6a is arranged on the second interlayer insulator 42. Formed on the data line 6a is the third interlayer insulator 43 through which the contact hole 85 leading to the intermediary layer 71 is opened. The upper light shield layer 401 is formed on the third interlayer insulator 43. Arranged on the upper light shield layer 401 is the fourth interlayer insulator 44, through which the contact hole 85 is opened. The pixel electrode 9a is deposited on the fourth interlayer insulator 44 thus constructed.

In the third embodiment as described above, the elements and lines formed in the image display area of the TFT array substrate 10, such as the TFT 30, the scanning line 3a, the data line 6a, the capacitive line 300, and the storage capacitor 70, are three-dimensionally light shielded by the lower light shield layer 400, the upper light shield layer 401, and the side wall light shield layer 402. The lower light shield layer 400, the upper light shield layer 401, and the side wall light shield layer 402 prevent light rays entering the substrate vertically or obliquely from above, returning light rays entering the substrate vertically or obliquely from below, and internally reflected light or multiple reflected light in response to these light rays, from entering the channel region 1a', the lightly doped source region 1b, and the lightly doped drain region 1c of the TFT 30. Furthermore, as shown in FIG. 18, the non-aperture area of each pixel is accurately defined in a grid configuration by these light shield layers.

In accordance with the third embodiment, the electrically conductive, light shield layer 403 formed in the contact hole 85 reliably prevents light from entering into the vicinity of the contact hole 85 which is subject to light ingress. The contact hole 85 is allowed to open at a center position between the TFT 30 and a TFT 30 adjoining the TFT 30 as shown in FIG. 18. Even if a slight degree of light ingress takes place through the contact hole 85, the light ingress point is spaced apart from the TFT 30 of interest, and most light is unable to reach the TFT 30.

As a result, the third embodiment increases light tightness, and allows the TFT 30 with reduced leakage photocurrent leakage thereof to perform correctly switching control on the pixel electrode 9a under severe operational conditions in which highintensity light and returning light are present. The present invention thus presents a bright and high-contrast image.

In accordance with the third embodiment, the lower light shield layer 400 is deposited on the bottom of the trench 10CV formed in the TFT array substrate 10, and the upper light shield layer 401 is arranged over the TFT 30 accommodated in the trench 10CV. The side wall light shield layer 402 fills the groove extending from the upper light shield layer 401 to the lower light shield layer 400 outside the TFT 30.

The TFT 30 is reliably three-dimensionally light shielded in a relatively simple construction using a relatively simple manufacturing process such as an etching step and a film formation step as in the manufacturing method in the first embodiment. In the third embodiment, the upper light shield layer 401 and the side wall light shield layer 402 may be integrally formed as in the first and the second embodiment. For example, the upper light shield layer 401 may be laminated to fill the groove after the groove has been formed.

In the third embodiment, the light shield layer may be arranged on the counter substrate 20 in an area thereof facing the contact hole 85. In this arrangement, light ingress in the vicinity of the contact hole 85 is further reduced.

The semiconductor layer 1a forming the pixel switching TFT 30 in the third embodiment may be a non-monocrystal layer or a monocrystal layer. A known technique such as an alignment method may be applied for the formation of the monocrystal layer. With the semiconductor layer 1a formed of a monocrystal layer, the performance of the peripheral circuits is increased.

Figure 21:
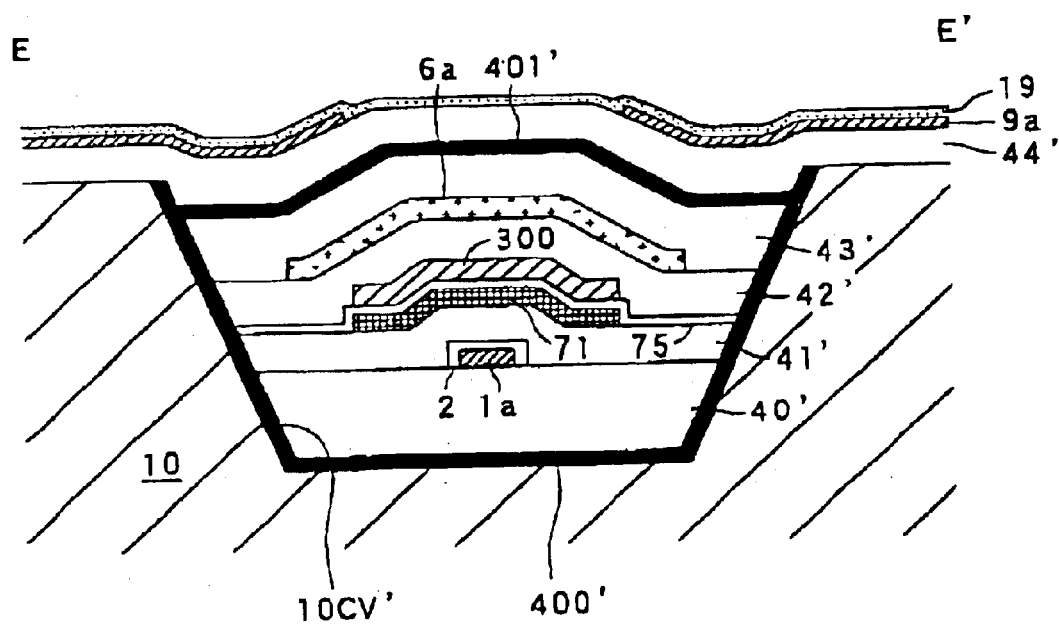
FIG. 21 is a cross-sectional view of the TFT array of a fourth embodiment at a section corresponding to that taken along line E–E' in FIG. 18.

The electrooptical device of a fourth embodiment of the present invention is discussed, referring to FIG. 21. FIG. 21 is a cross-sectional view of the electrooptical device of the fourth embodiment, corresponding to the cross section at line E–E' in FIG. 18.

In the fourth embodiment, as shown in FIG. 21, a trench 10CV' formed in the TFT array substrate 10 is deeper, the lower light shield layer 400 is deposited on the bottom and the tapered side walls of the trench 10CV'. An upper light shield layer 401' is arranged covering the large trench 10CV'. No side wall light shield layer is not arranged. The rest of the construction of the fourth embodiment remains unchanged from that of the third embodiment.

In accordance with the fourth embodiment, the TFT 30 and wiring are reliably three-dimensionally light shielded in a relatively simple construction using a relatively simple manufacturing process.

By adjusting the depth of the trench 10CV', the underlayer of the pixel electrode 9a in an area where the TFT 30 and the wiring are arranged, i.e., the surface of the fourth interlayer insulator 44' is planarized. In this way, orientation defects of the liquid crystal attributed to steps on the surface thereof are reduced.

Figure 22:
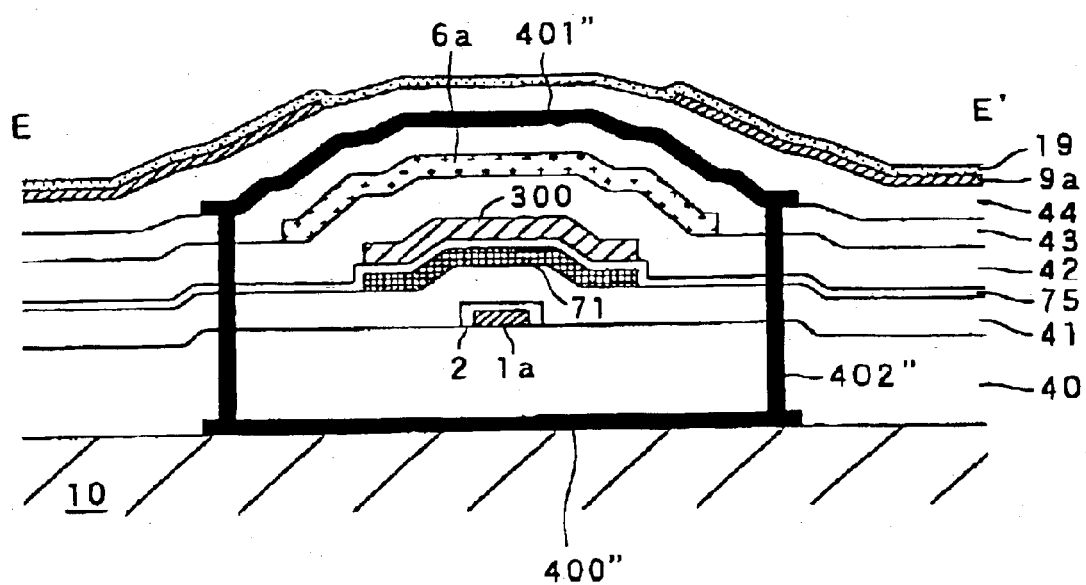
FIG. 22 is a cross-sectional view of the TFT array of a fifth embodiment at a section corresponding to that taken along line E–E' in FIG. 18.

The electrooptical device of a fifth embodiment of the present invention is now discussed, referring to FIG. 22.

FIG. 22 is a cross-sectional view of the electrooptical device of the fifth embodiment, corresponding to the cross section taken along line E–E' in FIG. 18.

Referring to FIG. 22, the fifth embodiment is different from the third embodiment in that no trench is formed in the TFT array substrate 10, and that a side wall light shield layer 402" is deposited in a groove which is accordingly formed deeper. With no trench formed, the lower light shield layer 400" is flat, and the presence of the layers from the underlayer insulator 40" to the data line 6a to the upper light shield layer 401" causes the surface of the fourth interlayer insulator 44" to be raised in a ridge. The rest of the construction of the fifth embodiment remains unchanged from that of the third embodiment. Although not shown in FIG. 22, the fourth interlayer insulator 44" is also raised in a ridge along the scanning line 3a.

In accordance with the fifth embodiment, the TFT 30 and the wiring are reliably three-dimensionally light shielded in a relatively simple construction using a relatively simple manufacturing process.

The electrooptical embodiment of a sixth embodiment is discussed, referring to FIG. 23. FIG. 23 is a plan view of a plurality of pixel electrodes diagrammatically showing the relationship between the polarity of a driving voltage in each pixel and a generation area of a transverse electric field in an electrooptical device of the sixth embodiment of the present invention during a scanning line alternating driving operation.

Referring to FIG. 23(a), during the presentation of a n-th (n is a natural number) field video signal or frame video signal, the polarity of the liquid crystal driving voltage represented by + or − in each pixel electrode 9a is not inverted, and the pixel electrodes 9a are driven by the same polarity on a row by row basis. Referring to FIG. 23(b), during the presentation of a (n+1)th field video signal or frame video signal, the voltage polarity of the liquid-crystal driving voltage in the pixel electrodes 9a is inverted, and during the presentation of the (n+1)-th field or frame video signal, the polarity of the liquid-crystal driving voltage represented by + or − in each pixel electrode 9a is not inverted, and the pixel electrodes 9a are driven by the same polarity on a row by row basis. The states shown in FIG. 23(a) and FIG. 23(b) are repeated with the period of field and frame, and the device is driven in the scanning line alternating driving method in this embodiment. As a result, in accordance with this embodiment, the device is free from the degradation of the liquid crystal through the application of the direct current while presenting an image with reduced cross talk and reduced flickering. The scanning line alternating driving method outperforms the data line alternating driving method in that almost no vertical cross talk is presented, and the scanning line alternating driving method outperforms the dot alternating driving method in that an area suffering from the transverse electric field is substantially small.

Referring to FIG. 23(a) and FIG. 23(b), in the scanning line alternating driving method, the generation area C1 of the transverse electric field is always located in the spacing between pixel electrodes 9a adjacent in a direction of columns (a Y direction).

In accordance with the sixth embodiment, as in the fifth embodiment, no trench is formed in the generation area C1 of the transverse electric field present in the gap area between the pixels along the scanning line 3a. A ridge is formed on the underlayer beneath the pixel electrode 9a. In the gap area, between the pixels, along the data line 6a, where no transverse electric field takes place, a deep trench is formed in the TFT array substrate 10 as in the fourth embodiment to planarize the underlayer beneath the pixel electrode 9a.

In accordance with the sixth embodiment, the use of the scanning line alternating driving method prevents the electrooptical material from being degraded by the application of a direct current voltage, while controlling cross-talk and flickering in a presented image. The longitudinal electric field is strengthened by raising the underlayer in a ridge beneath the pixel electrode 9a in the generation area C1 of the transverse electric field. The transverse electric field is thus relatively weakened. This arrangement reduces the orientation defects of the liquid crystal due to the transverse electric field.

The underlayer beneath the pixel electrode 9a is planarized by forming the deep trench in the gap area where no transverse electric field takes place. This arrangement reduces the orientation defect of the liquid crystal due to the step in the underlayer beneath the pixel electrode 9a.

As a result, the operational fault attributed to the transverse electric field in the electrooptical material such as a liquid crystal is substantially reduced, while a high-contrast, high-quality and bright image is thus presented.

When the data line alternating driving method is adopted instead of the scanning line alternating driving method, the longitudinal electric field is strengthened in the gap area, between pixels, extending along the data line 6a, namely, the generation area of the transverse electric field. To this end, the underlayer extending along the data line 6a is raised in a ridge while the underlayer beneath the pixel electrode 9a extending along the scanning line 3a is planarized. When the dot alternating driving method is adopted, the underlayer beneath the pixel electrode 9a is raised in a ridge in the areas along the scanning line 3a and the data line 6a in order to strengthen the longitudinal electric field in the gap areas between the pixels extending along the scanning line 3a and the data line 6a, namely the generation area of the traverse electric field.

In the scanning line alternating driving method of this invention, the polarity of the driving voltage may be inverted every row, every two adjacent rows, or every plural number of adjacent rows. Similarly, the polarity of the driving voltage may be inverted every column, every two adjacent columns, or every plural number of adjacent columns in the data line alternating driving method of the present invention. In the dot alternating driving method, the polarity of the driving voltage may be inverted every block composed of a plurality of pixel electrodes.

Figure 24:
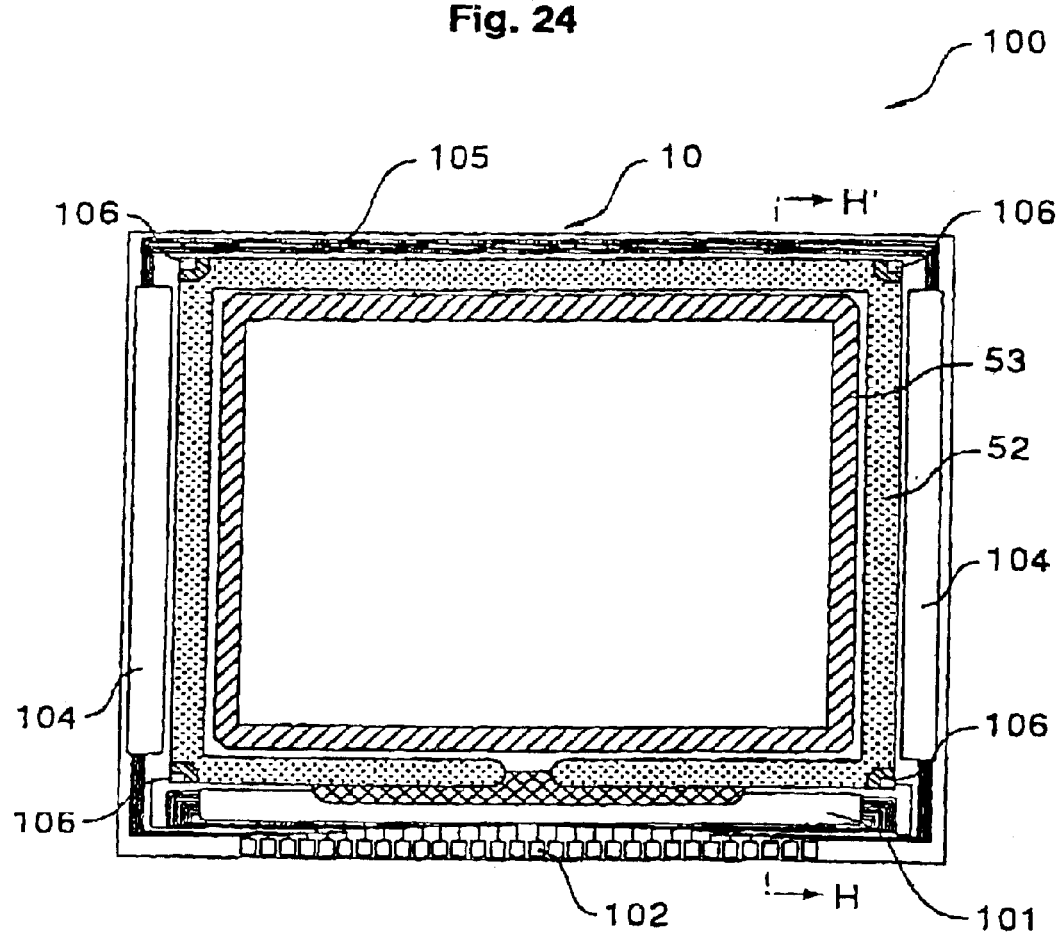
FIG. 24 is a plan view showing the electrooptical device viewed from a counter substrate.
Figure 25:
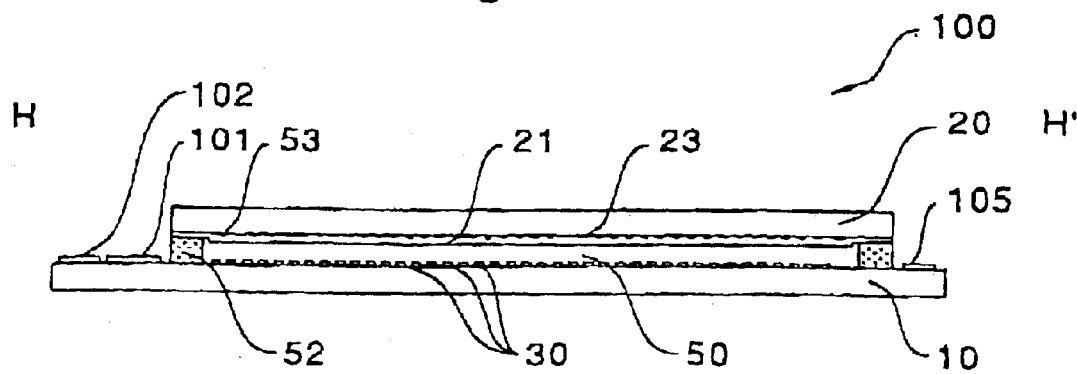
FIG. 25 is a cross-sectional view of the electrooptical device taken along line H–H' in FIG. 24.

The general construction of the electrooptical device in each of the above embodiments will now be discussed, referring to FIG. 24 and FIG. 25. FIG. 24 is a plan view of the electrooptical device 100 with elements formed thereon, viewed from the counter substrate 20. FIG. 25 is a cross-sectional view of the electrooptical device including the counter substrate 20 taken along line H–H' in FIG. 24.

Referring to FIG. 24, the TFT array substrate 10 is provided with a sealing material 52 along the edge thereof, and a third light shield layer 53 as a display peripheral outline, fabricated of the same material as that of the light shield layer extends along the internal edge of the sealing material 52. A data line driving circuit 101 and external-circuit interconnect terminals 102 are arranged on one side of the TFT array substrate 10, being external to the area of the sealing material 52, and scanning line driving circuits 104 are arranged on two sides adjacent to the one side of the TFT array substrate 10. If a delay in the scanning signal supplied to the scanning line 3a presents no problem, the scanning line driving circuit 104 may be mounted only on one side. Data line driving circuits 101 may be arranged on both sides of the image display area. For instance, odd data lines 6a may be supplied with the video signal by the data line driving circuit arranged on one side of the image display area, and even data lines 6a may be supplied with the video signal by the data line driving circuit arranged on the opposite side of the image display area. If the data lines 6a are driven in such an interdigital fashion, the formation area of the data line driving circuits 101 is expanded, and a complex circuit may be incorporated therewithin. Arranged on the remaining one side of the image display area of the TFT array substrate 10 is a plurality of wire 105 for connecting the scanning line driving circuits 104 mounted on the both sides of the image display area. A conductive material 106 for electrically connecting the TFT array substrate 10 to the counter substrate 20 is mounted at least at one corner of the counter substrate 20. Referring to FIG. 25, the counter substrate 20 having almost the same outline as that of the sealing material 52 shown in FIG. 24 is bonded to the TFT array substrate 10 through the sealing material 52.

Besides the data line driving circuits 101 and the scanning line driving circuit 104, the TFT array substrate 10 may be provided with a sampling circuit for applying the video signal to the plurality of the data lines 6a at a predetermined timing, a precharge circuit for supplying a precharge signal at a predetermined voltage level to the plurality of the data lines 6a prior to the application of the video signal, and a test circuit for checking the quality and defects of the electrooptical device in the middle of the production or at the shipment thereof. The sampling circuit, the precharge circuit, and the test circuit may be arranged in an area beneath the light shield layer 53.

In each of the above-referenced embodiments, the data line driving circuit 101 and the scanning line driving circuit 104 may be electrically and mechanically connected to a driver LSI mounted on a TAB (Tape Automated Bonding board), through an anisotropically electrically conductive film arranged in the vicinity of the TFT array substrate 10, instead of mounting the data line driving circuit 101 and the scanning line driving circuit 104 on the TFT array substrate 10. Arranged on the light incident side of the counter substrate 20 and the light exit side of the TFT array substrate 10 are respectively polarizer films, retardation films, and polarizer means in predetermined directions to work with operation modes of the liquid crystal 50 such as a TN (twisted nematic) mode, a VA (Vertically Aligned) mode, or a PDLC (Polymer Dispersed Liquid Crystal) mode, and normally white mode/normally black modes.

The electrooptical device thus constructed may be used in a projection-type display apparatus (a liquid-crystal projector). Three panels of the electrooptical devices 100 are used as RGB light valves, and each light valve receives each color light separated through RGB color separating dichroic mirrors. In each of the above embodiments, the electrooptical device 100 is equipped with no color filter. Optionally, an RGB color filter may be arranged in a predetermined area facing the pixel electrode 9a, on the counter substrate 20 along with a protective film. In this way, the liquid-crystal display device of each embodiment finds applications in a direct viewing or reflective type color liquid-crystal television, besides the liquid-crystal projector. Microlenses may be arranged on the counter substrate 20 on a one microlens per pixel basis. A color filter layer may be formed of a color resist beneath the pixel electrodes 9a facing the RGB on the TFT array substrate 10. In this way, condensation efficiency of the incident light is increased, and a liquid-crystal display device provides a bright image. By laminating interference layers having different refractive indexes on the counter substrate 20, a dichroic filter for creating the RGB colors is formed taking advantage of interference of light. The counter substrate with such a dichroic filter allows a liquid-crystal display device to provide an even brighter image.

An example of the pixel switching TFT used in each pixel is a positive stagger type or coplanar type polysilicon TFT as explained earlier. Other types of TFTs including a reverse stagger type TFT or an amorphous silicon TFT may be used for other pixel switching TFT.

Figure 26:
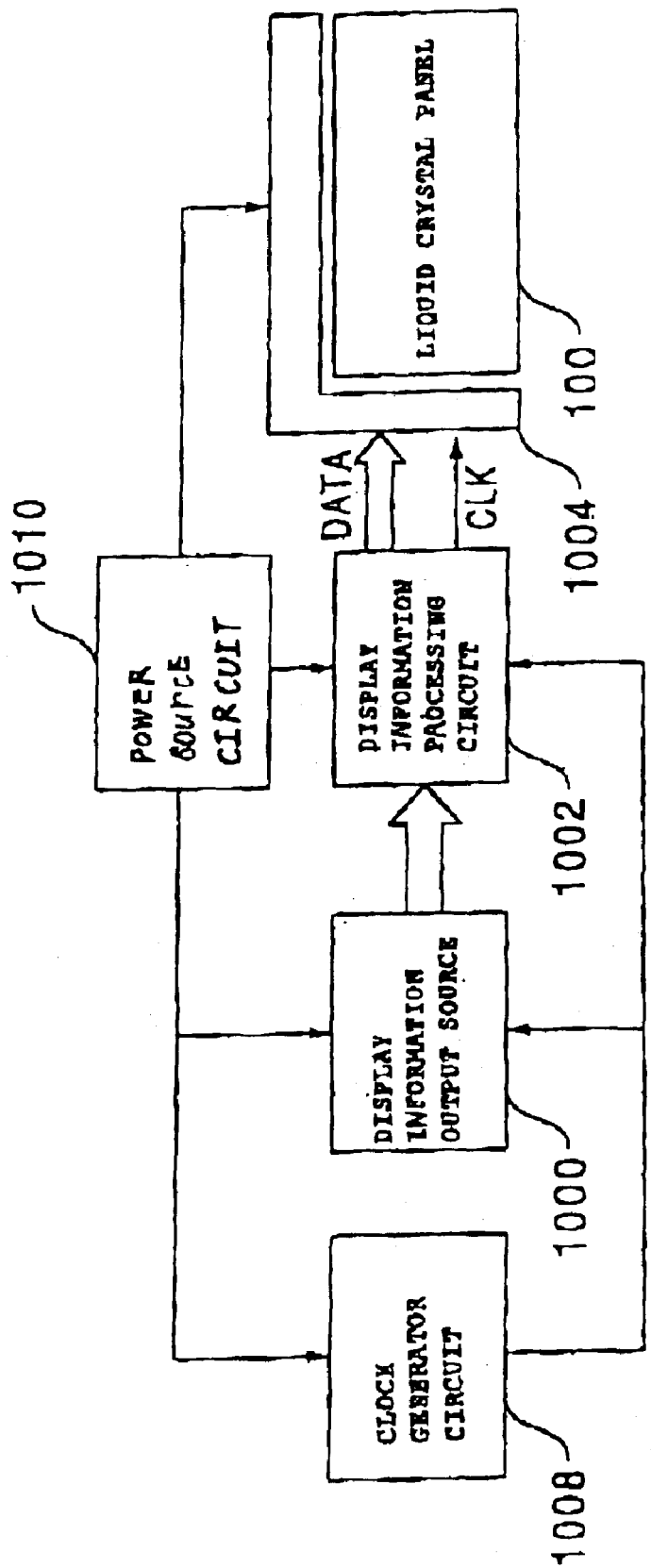
FIG. 26 is a block diagram showing a circuit arrangement of a projection-type display apparatus as one example of electronic equipment incorporating the electrooptical device of the present invention as a display apparatus.
Figure 27:
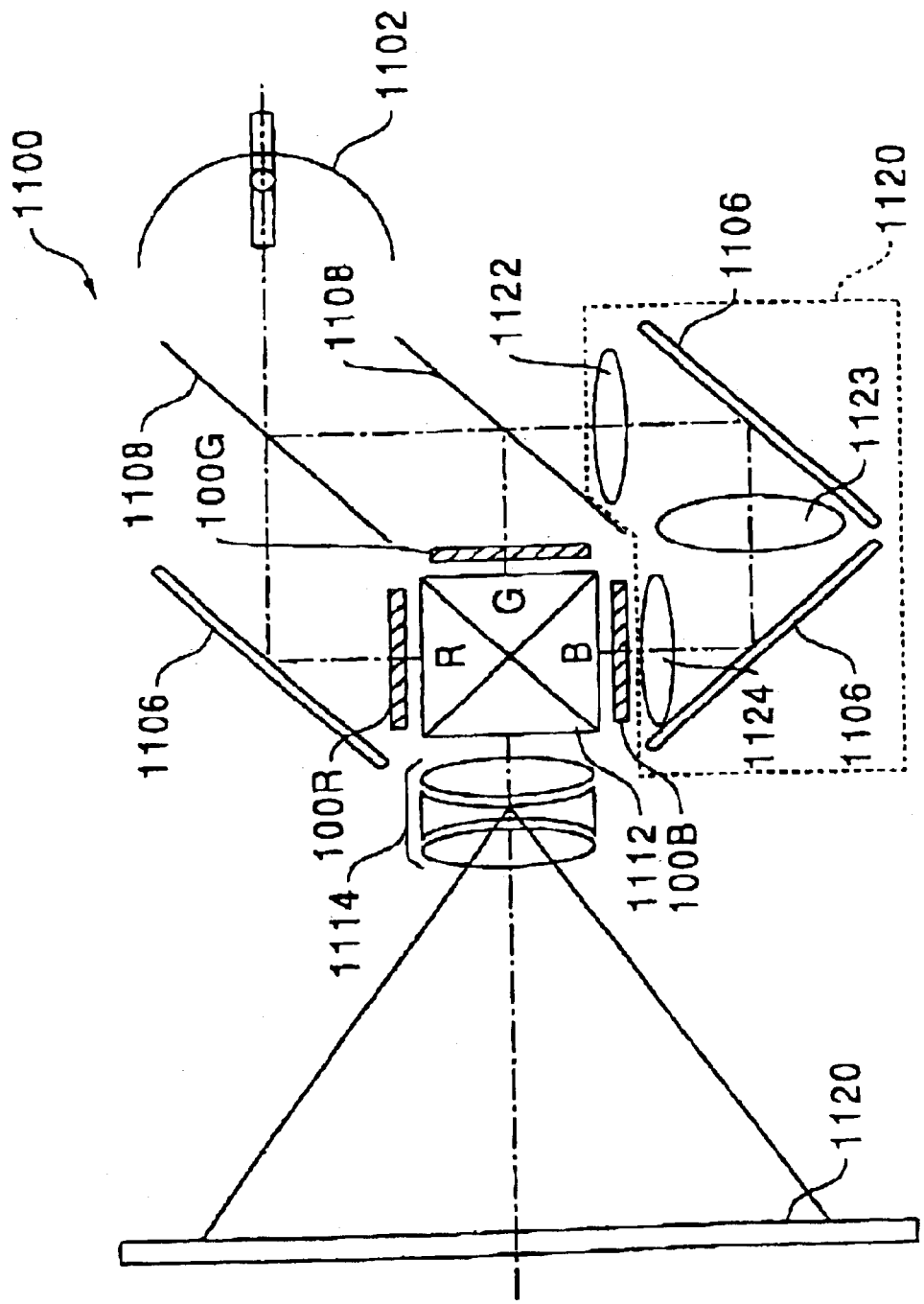
FIG. 27 is a cross-sectional view showing an optical system of the projection-type display apparatus as electronic equipment incorporating the electrooptical device of the present invention.

Discussed next is an embodiment of a projection-type color display apparatus as one example of electronic equipment incorporating the above-referenced electrooptical device as a light valve as shown in FIG. 26 and FIG. 27.

Referring to FIG. 26, the circuit arrangement of the projection-type color display apparatus of this embodiment will now be discussed. FIG. 26 shows the circuit arrangement of one of the three light valves in the projection-type color display apparatus. Since the three light valves basically have the same structure, only one of these valves is discussed. Precisely speaking, however, the three light valves are driven by different input signals (namely, R, G, and B signals). Furthermore, the circuit arrangement of the G light valve changes the order of the video signal to be presented in reverse order within each field or each frame, in comparison with the R and B video signals, or reverses the direction of the horizontal scanning or the vertical scanning.

As shown in FIG. 26, the projection-type color display apparatus includes a display information output source 1000, a display information processing circuit 1002, a drive circuit 1004, the above liquid crystal device 100, a clock generator circuit 1008, and a power source circuit 1010. The display information output source 1000 can include a memory, such as a ROM (Read Only Memory), a RAM (Random Access Memory), or an optical disk, and a tuning circuit for outputting a video signal by tuning to the video signal, and outputs, to the display information processing circuit 1002, display information such as a video signal in a predetermined format in response to a clock signal from the clock generator circuit 1008. The display information processing circuit 1002 can include a variety of known processing circuits, such as an amplifier and polarity reversal circuit, a serial-to-parallel converter circuit, a rotation circuit, a gamma correction circuit, and a clamp circuit, and successively generates a digital signal from display information input in response to the clock signal, and then outputs, to the drive circuit 1004, the digital signal along with the clock signal CLK. The drive circuit 1004 also drives the liquid-crystal device 100. The power source circuit 1010 supplies predetermined power to each of the above circuits. The driving circuit 1004 may be mounted on the TFT array substrate of the electrooptical device 100, and further, the display information processing circuit 1002 may also be mounted on the TFT array substrate.

Referring to FIG. 27, the general construction of the projection-type color display apparatus of this embodiment will now be discussed (from the standpoint of optical structure). FIG. 27 is a diagrammatic cross-sectional view of the projection-type color display apparatus.

Referring to FIG. 27, a liquid-crystal projector 1100 as one example of the projection-type color display apparatus of this embodiment includes three liquid-crystal modules, each including the electrooptical device 100 having the driving circuit 1004 on the TFT array substrate. The liquid-crystal projector 1100 thus includes light valves 100R, 100G, and 100B for RGB colors. When light is emitted from a lamp unit 1102 as a white light source such as a metal halide lamp in the liquid-crystal projector 1100, the light is separated into three RGB color beams through three mirrors 1106 and two dichroic mirrors 1108, and the three color light beams are then guided to respective light valves 100R, 100G, and 100B. The blue color beam travels along a path longer than those for the red and green color beams, and to prevent loss, the blue color beam is guided through a relay lens system 1121, including an incident lens 1122, a relay lens 1123, and an exit lens 1124. The red, green, and blue light beams respectively color-modulated by the light valves 100R, 100G, and 100B are incident on a dichroic prism 1112, thereby synthesizing the three color images, and a synthesized color image is then projected by a projection lens 1114 onto a screen 1120.

An electrooptical device of the present invention assures light tightness, and presents a bright, high-quality image. The electrooptical device of the present invention may be used as a display apparatus including a display area of a variety of electronic equipment, besides a projection-type display apparatus, such as a liquid crystal display television, a viewfinder type or direct monitoring type video cassette recorder, a car navigation system, an electronic pocketbook, an electronic tabletop calculator, a word processor, a workstation, a mobile telephone, a video phone, a POS terminal, and an apparatus having a touch panel.

The present invention is not limited to the above-referenced embodiments, and modifications are possible within the scope of the present invention as in the claims and the specification, and the electrooptical device, the projection-type display apparatus, and the method of manufacturing the electrooptical device, with such modifications accordingly fall within the spirit and scope of the present invention.

What is claimed is:

1. An electrooptical device comprising, above a substrate:
   a pixel electrode;
   a thin-film transistor coupled to the pixel electrode;
   a drain electrode connected to a drain region of the thin-film transistor; and
   a source electrode connected to a source region of the thin-film transistor; and
   a light shield member three-dimensionally covering the thin-film transistors the drain electrode and the source electrode.

2. The electrooptical device according to claim 1, wherein the light shield member further comprises one light shield layer deposited on the bottom surface and the side portion of a trench formed in the substrate and accommodating the thin-film transistor, the drain electrode and the source electrode, and
   another light shield layer covering the trench from above.

3. The electrooptical device according to claim 1, wherein the light shield member further comprises a lower light shield layer deposited on the substrate,
   an upper light shield layer deposited above the thin-film transistor, the drain electrode and the source electrode, formed above the lower light shield layer, and
   a side portion light shield layer filling a groove formed from the upper light shield layer to the lower light shield layer outside the thin-film transistor, the drain electrode and the source electrode in a plan view.

4. The electrooptical device according to claim 1, wherein the light shield member further comprises:

in one plane area thereof, one light shield layer deposited on a bottom surface and a side portion of a trench formed in the substrate and accommodating the thin-film transistor, the drain electrode and the source electrode, and another light shield layer covering the trench from above; and in another plane area, a lower light shield layer deposited above the substrate, an upper light shield layer deposited above the thin-film transistor and the wiring, formed on the lower light shield layer, and a side wall light shield layer filling a groove formed from the upper light shield layer to the lower light shield layer outside the thin-film transistor, the drain electrode and the source electrode in a plan view.

5. The electrooptical device according to claim 1, wherein the light shield member further comprises:

one light shield layer deposited on the bottom surface and the side portion of a trench formed in the substrate and partly accommodating the thin-film transistor, the drain electrode and the source electrode;

an upper light shield layer deposited above the thin-film transistor and the wiring formed above the one light shield layer; and a side portion light shield layer filling a groove formed from the upper light shield layer to the one light shield layer outside the thin-film transistor, the drain electrode and the source electrode in a plan view.

6. The electrooptical device according to claim 5, wherein the upper light shield layer and the side portion light shield layer are integrally formed.

7. An electrooptical device having a pair of first and second substrates with an electrooptical material disposed therebetween, and including above the first substrate:

a plurality of pixel electrodes arranged two-dimensionally, including a first pixel electrode group which is driven by an alternating driving method with a first period, and a second pixel electrode group which is driven in an alternating driving method with a second period that is complimentary to the first period;

a thin-film transistor connected to each pixel electrode;

a wiring connected to each thin-film transistor;

a light shield member which three-dimensionally covers the thin-film transistor and the wiring in a gap area between adjacent pixel electrodes in a plan view and protrudes in a ridge a portion of the gap area between adjacent pixel electrodes of different pixel electrode groups;

and including above the second substrate, a counter electrode facing the plurality of pixel electrodes.

8. The electrooptical device according to claim 7, wherein the light shield member comprises:

in an area between adjacent pixel electrodes of the same group, one light shield layer deposited on a bottom surface and a side wall of a trench formed in the substrate and accommodating the thin-film transistor and the wiring, and another light shield layer covering the trench from above;

and in an area between adjacent pixel electrodes of the different pixel electrode groups, a lower light shield layer deposited above the substrate, an upper light shield layer deposited above the thin-film transistor and the wiring, formed on the lower light shield layer, and a side portion light shield layer filling a groove formed from the upper light shield layer to the lower light shield layer outside the thin-film transistor and the wiring in a plan view.

9. The electrooptical device according to claim 8, wherein a planarizing process is performed on an underlayer under the pixel electrode in the area between the adjacent pixel electrodes of the same pixel electrode group.

10. The electrooptical device according to claim 8, wherein the upper light shield layer and the side portion light shield layer are integrally formed.

11. The electrooptical device according to claim 1, wherein the pixel electrode and the thin-film transistor are coupled to each other through an electrically conductive layer having a light shield property.

12. The electrooptical device according to claim 1, wherein a junction point between the pixel electrode and the thin-film transistor is positioned at the center between adjacent thin-film transistors in a plan view.

13. The electrooptical device according to claim 1, comprising a light shield layer formed above and facing the substrate and also facing a junction point between the pixel electrode and the thin-film transistor.

14. The electrooptical device according to claim 1, wherein the light shield member is formed of a film containing a refractory metal.

15. The electrooptical device according to claim 1 further includes scanning lines and data lines intersecting each other, and the light shield member is configured in a grid in a plan view.

16. The electrooptical device according to claim 1, further comprising a storage capacitor formed in a space three-dimensionally covered with the light shield member on the first substrate, and connected to the pixel electrode.

17. A projection-type display apparatus, comprising:

a light valve including, above a substrate, a pixel electrode, a thin-film transistor, a drain electrode connected to drain region of the thin-film transistor, a source electrode connected to a source region of the thin-film transistor, and a light shield member three-dimensionally covering the thin-film transistor, the drain electrode and the source electrode;

a light source for directing light to the light valve; and an optical system for projecting a light beam from the light valve.

* * * * *